(12) United States Patent
Yoshinari et al.

(10) Patent No.: US 11,435,511 B2
(45) Date of Patent: Sep. 6, 2022

(54) OPTICAL LAMINATE FILM AND ORGANIC ELECTROLUMINESCENT DISPLAY DEVICE

(71) Applicant: FUJIFILM Corporation, Tokyo (JP)

(72) Inventors: Shinichi Yoshinari, Kanagawa (JP);
Ayako Muramatsu, Kanagawa (JP);
Naoya Shibata, Kanagawa (JP);
Kunihiro Atsumi, Kanagawa (JP);
Daisuke Kashiwagi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 115 days.

(21) Appl. No.: 16/867,525

(22) Filed: May 5, 2020

(65) Prior Publication Data

US 2020/0264357 A1    Aug. 20, 2020

Related U.S. Application Data

(63) Continuation of application No. PCT/JP2018/041559, filed on Nov. 8, 2018.

(30) Foreign Application Priority Data

Nov. 8, 2017  (JP) ............................. JP2017-215827
Sep. 27, 2018  (JP) ............................. JP2018-182238

(51) Int. Cl.
*G02B 5/30*   (2006.01)
*H01L 27/32*  (2006.01)
(Continued)

(52) U.S. Cl.
CPC ........ *G02B 5/3016* (2013.01); *H01L 27/3244* (2013.01); *H01L 51/5281* (2013.01);
(Continued)

(58) Field of Classification Search
CPC .............. G02B 5/3016; H01L 27/3244; H01L 51/5281; G09F 9/00; G09F 9/30; H05B 33/02
See application file for complete search history.

(56) References Cited

U.S. PATENT DOCUMENTS 7,012,365 B2   3/2006  Adachi et al.
7,339,316 B2   3/2008  Adachi et al.
(Continued)

FOREIGN PATENT DOCUMENTS

JP    2001316428    11/2001
JP    4011292       11/2007
(Continued)

OTHER PUBLICATIONS

"International Search Report (Form PCT/ISA/210) of PCT/JP2018/041559," dated Feb. 12, 2019, with English translation thereof, pp. 1-4.
(Continued)

*Primary Examiner* — Anthony J Frost
(74) *Attorney, Agent, or Firm* — JCIPRNET

(57) ABSTRACT

An object of the present invention is to provide is an optical laminate film exhibiting excellent uniformity in reflection tint and an organic EL display device using this optical laminate film and exhibiting excellent uniformity in reflection tint when turned off. The object is achieved by providing an optical laminate film including a polarizer, a phase difference layer, and a circularly polarized light separating layer in this order, in which an in-plane retardation Re(550) of the phase difference layer is 120 to 160 nm, the polarizer and the phase difference layer are arranged to form an angle of 45°±10°, the circularly polarized light separating layer is a cholesteric liquid crystal layer formed by fixing a cholesteric liquid crystalline phase, in a case where an average refractive index of the liquid crystal compound forming the
(Continued)

circularly polarized light separating layer is n, a birefringence thereof is $\Delta n$, and a selective reflection center wavelength thereof is $\lambda$, it is "ReMAX [nm]=k×$\Delta n$×$\lambda$/n (where k=0.213)", and an in-plane retardation Re(550) of the circularly polarized light separating layer satisfies "0.5×ReMax≤Re(550)≤R.

3 Claims, 5 Drawing Sheets

(51) Int. Cl.
  *H01L 51/52* (2006.01)
  *G09F 9/30* (2006.01)
  *H05B 33/02* (2006.01)
  *G09F 9/00* (2006.01)

(52) U.S. Cl.
  CPC ................ *G09F 9/00* (2013.01); *G09F 9/30* (2013.01); *H05B 33/02* (2013.01)

(56) References Cited

U.S. PATENT DOCUMENTS

| | | |
|---|---|---|
| 7,781,962 B2 | 8/2010 | Adachi et al. |
| 2002/0093284 A1 | 7/2002 | Adachi et al. |
| 2015/0109561 A1* | 4/2015 | Fuchida ............... G02B 5/3025 349/96 |
| 2016/0085101 A1* | 3/2016 | Saitoh ............... G02F 1/133617 349/71 |
| 2016/0342003 A1* | 11/2016 | Takeda ............... C09K 19/2014 |
| 2018/0164481 A1* | 6/2018 | Atsumi ............... G02F 1/13363 |

FOREIGN PATENT DOCUMENTS

| | | | |
|---|---|---|---|
| JP | 2011186158 | 9/2011 | |
| JP | WO2017033468 | * 3/2017 | ....... G02F 1/133536 |
| JP | 2017097217 | 6/2017 | |
| WO | 2017033468 | 3/2017 | |

OTHER PUBLICATIONS

"Written Opinion of the International Searching Authority (Form PCT/ISA/237) of PCT/JP2018/041559," dated Feb. 12, 2019, with English translation thereof, pp. 1-7.

* cited by examiner

OPTICAL LAMINATE FILM AND ORGANIC ELECTROLUMINESCENT DISPLAY DEVICE

CROSS-REFERENCE TO RELATED APPLICATIONS

This application is a Continuation of PCT International Application No. PCT/JP2018/041559 filed on Nov. 8, 2018, which claims priority under 35 U.S.C. § 119(a) to Japanese Patent Application No. 2017-215827 filed on Nov. 8, 2017 and Japanese Patent Application No. 2018-182238 filed on Sep. 27, 2018. Each of the above applications is hereby expressly incorporated by reference, in its entirety, into the present application.

BACKGROUND OF THE INVENTION

1. Field of the Invention

The present invention relates to an optical laminate film and an organic electroluminescent display device.

2. Description of the Related Art

In recent years, development of organic electro luminescence (EL, (Organic Light Emitting Diode (OLED)) has been accelerated as a display device to replace a liquid crystal display, and a 60-inch class large display has already begun to appear.

In addition, since the organic EL substrate has a high surface reflectivity, the organic EL substrate reflects external light particularly in a bright environment, and the contrast is deteriorated. Therefore, in the organic EL display device, an antireflection film including a polarizer and a phase difference layer ($\lambda/4$ plate) is arranged.

However, in this configuration, although the deterioration of the contrast due to the reflection of the organic EL substrate can be prevented, the light emitted from the organic EL element is absorbed by the polarizer of the antireflection film, so that the brightness is reduced. Thus, the performance of the organic EL light emitting element or the like cannot be sufficiently exhibited.

In order to solve this problem, it is known that a cholesteric liquid crystal layer formed by fixing a cholesteric liquid crystalline phase is arranged between an antireflection film and an organic EL light emitting element (JP4011292B).

It is known that a cholesteric liquid crystal layer has a function of selectively reflecting a specific circularly polarized light component in a specific wavelength range. Therefore, by arranging the cholesteric liquid crystal layer between the antireflection film and the organic EL substrate, the circularly polarized light component, which would otherwise be absorbed by the polarizer, can be used by reflecting the circularly polarized light component by the cholesteric liquid crystal layer, reflecting the circularly polarized light component by the organic EL substrate again, and converting the circularly polarized light component into a circularly polarized light component that is not absorbed by the polarizer. As a result, it is possible to suppress a decrease in brightness caused by the antireflection film including the polarizer and the $\lambda/4$ plate.

SUMMARY OF THE INVENTION

In order to improve the properties of an organic EL display device having such a cholesteric liquid crystal layer, the present inventors have prepared a cholesteric liquid crystal layer that selectively reflects blue light, and have investigated an organic EL display device having the above-described configuration.

As a result, it has been found that in a large area organic EL display device, the reflection tint in a case where the organic EL display device is viewed from the front when turned off differs depending on the region, and a large problem may occur. For example, a 55-inch size TV screen has a size of 121.5×68.5 cm, and it has been found that it is an important problem to realize a uniform tint in such a wide range.

An object of the present invention is to provide an optical laminate film including a polarizer, a phase difference layer, and a circularly polarized light separating layer and having a uniform reflection tint even in a large size, and an organic EL display device using this optical laminate film and having excellent uniformity in reflection tint even in a large size when turned off.

In order to solve this problem, the present invention has the following configuration.

[1] An optical laminate film comprising, at least: a polarizer; a phase difference layer; and a circularly polarized light separating layer, in which the polarizer, the phase difference layer, and the circularly polarized light separating layer are arranged in this order, an in-plane retardation Re(550) of the phase difference layer is 120 to 160 nm, the polarizer and the phase difference layer are arranged such that an angle formed between a transmission axis of the polarizer and a slow axis of the phase difference layer is 45°±10°, the circularly polarized light separating layer is a cholesteric liquid crystal layer formed by fixing a cholesteric liquid crystalline phase and having a liquid crystal compound as a main component, in a case where an average refractive index of the liquid crystal compound forming the circularly polarized light separating layer is n, a birefringence of the liquid crystal compound forming the circularly polarized light separating layer is Δn, and a selective reflection center wavelength of the circularly polarized light separating layer is λ, $Re\ \text{MAX}[nm]=k\times\Delta n\times\lambda/n$ (where $k=0.213$), and an in-plane retardation Re(550) of the circularly polarized light separating layer satisfies $0.5\times Re\text{Max}\leq Re(550)\leq Re\text{Max}.$

[2] The optical laminate film according to [1], in which the in-plane retardation Re(550) of the circularly polarized light separating layer satisfies $0.7\times Re\text{Max}\leq Re(550)\leq Re\text{Max}.$

[3] The optical laminate film according to [1] or [2], in which a selective reflection center wavelength of the circularly polarized light separating layer is in a range of 430 to 480 nm.

[4] The optical laminate film of [1] or [2], in which a selective reflection center wavelength of the circularly polarized light separating layer is in a range of 700 to 800 nm.

[5] The optical laminate film according to any one of [1] to [4], in which the phase difference layer exhibits reciprocal wavelength dispersibility.

[6] The optical laminate film according to any one of [1] to [5], in which the circularly polarized light separating layer is formed of a disk-like liquid crystal compound.

[7] The optical laminate film according to any one of [1] to [6], in which an average value of a maximum value of an angle formed between the slow axis of the phase difference layer and a slow axis of the circularly polarized light separating layer and a minimum value of the angle formed between the slow axis of the phase difference layer and the slow axis of the circularly polarized light separating layer is within a range of −25° to 25°.

[8] The optical laminate film according to any one of [1] to [7], in which the number of spiral turns of the circularly polarized light separating layer is 1.5 to 6.5.

[9] An organic electroluminescent display device comprising: the optical laminate film according to any one of [1] to [8], and an organic electroluminescent light emitting element, in which the optical laminate film and the organic electroluminescent light emitting element are arranged so as to sandwich the circularly polarized light separating layer between the phase difference layer and the organic electroluminescent light emitting element.

[10] The organic electroluminescent display device according to [9], in which a total of retardations Rth(550) in a thickness direction of members arranged between the polarizer and the organic electroluminescent light emitting element is −50 to 50 nm.

[11] The organic electroluminescent display device according to [9] or [10], further comprising: a C-plate between the polarizer and the organic electroluminescent light emitting element.

According to the present invention, it is possible to provide an optical laminate film having excellent uniformity in reflection tint even in a large size, and an organic EL display device having excellent in uniformity in reflection tint when turned off even in a large size.

DESCRIPTION OF THE PREFERRED EMBODIMENTS

Figure 1:
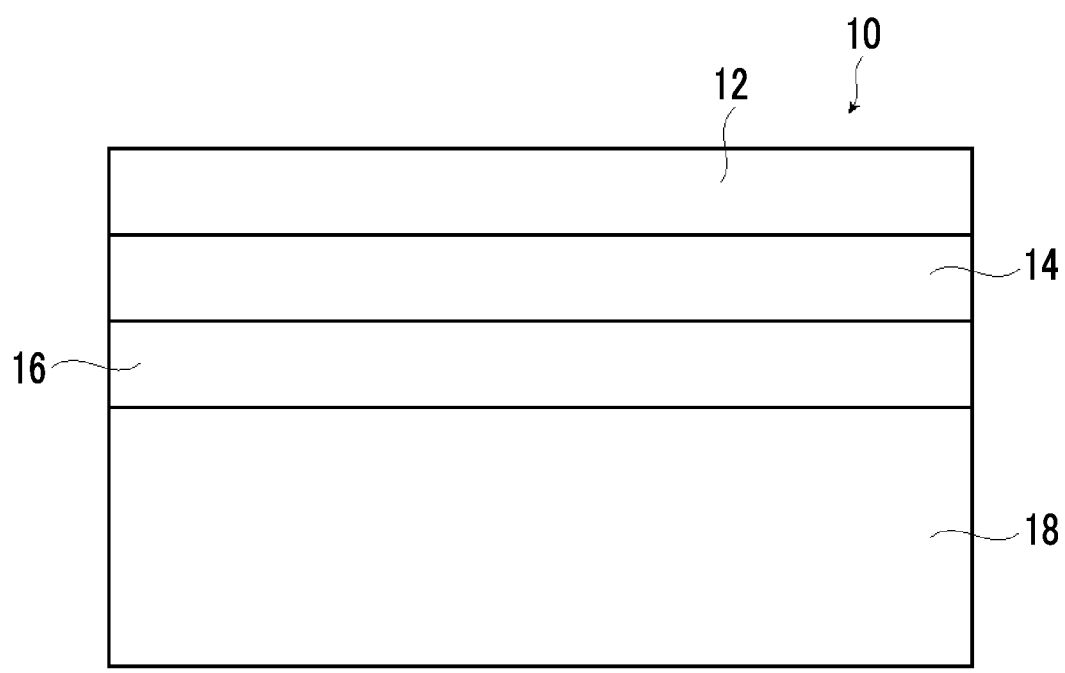
FIG. 1 is a conceptual view showing an example of an organic EL display device according to the present invention.

Hereinafter, an optical laminate film and an organic electroluminescent display device (organic EL display device) according to embodiments of the present invention will be described in detail.

In the present specification, Re(λ) and Rth(λ) represent an in-plane retardation and a retardation in a thickness direction at a wavelength of λ, respectively. Unless specified otherwise, the wavelength λ is 550 nm.

In the present specification, Re(λ) and Rth(λ) are values measured at a wavelength of λ using AxoScan (manufactured by Axometrics Inc.). By inputting an average refractive index ((nx+ny+nz)/3) and a film thickness (d (μm)) in AxoScan, the following expressions can be calculated.

Slow axis direction (°)

$$Re(\lambda)=R0(\lambda)$$

$$Rth(\lambda)=((nx+ny)/2-nz)\times d$$

R0(λ) is expressed as a numerical value calculated by AxoScan and represents Re(λ) but means Re(λ).

In the present specification, the refractive indexes nx, ny, and nz are measured using an Abbe refractive index (NAR-4T, manufactured by Atago Co., Ltd.) and a sodium lamp (λ=589 nm) as a light source. In a case where wavelength dependency is measured, a multi-wavelength Abbe refractometer DR-M2 (manufactured by Atago Co., Ltd.) can be used in combination with an interference filter.

In addition, values from the Polymer Handbook (John Wiley & Sons, Inc.) and catalogs of various optical films can be used. Examples of average refractive index values of main optical films are as follows: cellulose acylate (1.48), cycloolefin polymer (1.52), polycarbonate (1.59), polymethyl methacrylate (1.49), and polystyrene (1.59).

In the present specification, visible light refers to light which can be observed by human eyes among electromagnetic waves and refers to light in a wavelength range of 380 nm to 780 nm. Invisible light refers to light in a wavelength range of shorter than 380 nm or longer than 780 nm.

In addition, although not limited thereto, in visible light, light in a wavelength range of 420 to 490 nm is blue light, light in a wavelength range of 495 to 570 nm is green light, and light in a wavelength range of 620 to 750 nm is a red light.

<Organic Electroluminescent Display Device>

FIG. 1 conceptually shows an example of an organic electroluminescent display device according to an embodiment of the present invention. In the following description, the organic electroluminescent display device is also referred to as an organic EL display device.

An organic EL display device 10 according to an embodiment of the present invention shown in FIG. 1 has a polarizer 12, a phase difference layer 14, a circularly polarized light separating layer 16, and an organic electroluminescent light emitting element 18 in this order from a viewing side. In the following description, the organic electroluminescent light emitting element is also referred to as an organic EL light emitting element.

An antireflection film is constituted of the polarizer 12 and the phase difference layer 14, and the optical laminate film according to the embodiment of the present invention is constituted of the polarizer 12, the phase difference layer 14, and the circularly polarized light separating layer 16.

In the organic EL display device 10 (optical laminate film) of the embodiment of the present invention, the circularly polarized light separating layer 16 is provided in addition to the polarizer 12 and the phase difference layer 14, and a cholesteric liquid crystal layer is used as the circularly polarized light separating layer 16. According to the present invention, by adopting such a configuration, it is possible to improve display brightness in the organic EL display device 10, to promote extension of the lifetime of the organic EL element, and to suppress reflection of external light.

The circularly polarized light separating layer 16 is a cholesteric liquid crystal layer. Specifically, the cholesteric liquid crystal layer is a layer having a cholesteric liquid crystal structure formed by fixing a cholesteric liquid crystalline phase. As is well known, a cholesteric liquid crystal layer selectively reflects a specific circularly polarized light component in a specific wavelength range.

In the present invention, the selective reflection center wavelength of the circularly polarized light separating layer 16 is not limited, but the circularly polarized light separating layer 16 (cholesteric liquid crystal layer) preferably has a selective reflection center wavelength in a blue light wavelength range. That is, it is preferable that the circularly polarized light separating layer 16 selectively reflects blue light. Specifically, it is more preferable that the circularly polarized light separating layer 16 has a selective reflection center wavelength in a range of 430 to 480 nm.

The circularly polarized light separating layer 16 which is a cholesteric liquid crystal layer substantially becomes a C-plate since the chirality of the cholesteric liquid crystal is averaged for light outside the reflection range. In addition, since the cholesteric liquid crystal layer has a so-called short wave shift (blue shift) in which the light incident from an oblique direction has a reflection range that varies to the short wavelength side, a cholesteric liquid crystal layer which reflects blue light at the front functions as a C-plate in the visible range in the oblique direction.

Further, it is possible to suppress a reduction in antireflection effect in the front direction as much as possible by reflecting only blue light in the front direction. This is because the influence on brightness is small.

In addition, since there is a difference in energy required to emit light of each color in the organic EL light emitting element, generally, the deterioration of a blue light emitting element is faster than the deterioration of green light and red light emitting elements. Therefore, in consideration of the service life of the blue light emitting element, countermeasures such as suppressing the light emission amount (output) of the light emitting element of each color are taken. On the other hand, by providing the circularly polarized light separating layer that selectively reflects blue light, the brightness of blue light can be improved, and the overall display brightness can be improved. Also, the service life of the blue light emitting element, which is rapidly deteriorated, can be extended and thus the service life of the organic EL display device can be extended.

That is, in the organic EL display device 10 according to the embodiment of the present invention, the circularly polarized light separating layer 16 which is a cholesteric liquid crystal layer with blue light as a selective reflection center wavelength is arranged between the polarizer 12 and the phase difference layer 14, and the organic EL light emitting element 18 (organic EL light emitting element substrate) as a preferable embodiment.

Here, a combination of using a +A-plate of which Rth (550) has a positive value or a B-plate of which Rth(550) has a positive value as the phase difference layer 14, and a cholesteric liquid crystal layer formed of a disk-like liquid crystal compound as the cholesteric liquid crystal layer of the circularly polarized light separating layer 16 is more preferable. This is because the cholesteric liquid crystal layer formed of a disk-like liquid crystal compound functions as a +C-plate outside the reflection range. Further, the phase difference layer 14 (λ/4 film) preferably has reciprocal wavelength dispersibility.

Alternatively, a combination of using a –A-plate of which Rth(550) has a negative value or a B-plate of which Rth (550) has a negative value as the phase difference layer 14 and a cholesteric liquid crystal layer formed of a rod-like liquid crystal compound as the cholesteric liquid crystal layer of the circularly polarized light separating layer 16 is also preferable. This is because the cholesteric liquid crystal layer formed of a rod-like liquid crystal compound functions as a –C-plate outside the reflection range.

The A-plate, the B-plate, and the C-plate will be described later in detail.

[Polarizer]

The polarizer 12 may be a linear polarizer (linearly polarizing plate) having a transmission axis (polarization axis) in one direction and having a function of converting natural light into a specific linearly polarized light. As the polarizer 12, for example, various polarizers used for constituting antireflection layers can be used in various organic EL display devices.

Accordingly, for example, as the polarizer 12, any of an iodine-based polarizing plate, a dye-based polarizing plate using a dichroic dye, and a polyene-based polarizing plate can be used. The iodine-based polarizing plate and the dye-based polarizing plate are generally prepared by adsorbing iodine or a dichroic dye into polyvinyl alcohol and stretching the polyvinyl alcohol.

The polarizer 12 and the phase difference layer 14 described later are arranged such that an angle formed between the transmission axis (absorption axis) of the polarizer 12 and the slow axis of the phase difference layer 14 is 45°±10°.

Here, the polarizer 12 is arranged such that the direction of the transmission axis coincides with the direction of linearly polarized light emitted from the phase difference layer 14. Alternatively, the direction of the slow axis of the phase difference layer 14 described later is adjusted depending on the direction of circularly polarized light reflected by the circularly polarized light separating layer 16, so that the direction of linearly polarized light emitted by itself coincides with the transmission axis of the polarizer 12.

[Phase Difference Layer]

(Ranges of Retardation Re and Rth)

Regarding the in-plane retardation (Re(λ)) of the phase difference layer 14 in the present invention, from the viewpoint of antireflection, the range of Re(550) is 120 to 160 nm, preferably 125 to 155 nm, and more preferably 130 to 150 nm.

In addition, in consideration of combination with the circularly polarized light separating layer 16 (cholesteric liquid crystal layer), from the viewpoint of antireflection in the oblique direction, the absolute value of Rth(550) of the phase difference layer 14, which is a retardation in the thickness direction, is preferably 50 to 200 nm, more preferably 55 to 180 nm, and even more preferably 60 to 160 nm.

The phase difference layer 14 may be a single layer or a laminate of two or more layers. The phase difference layer 14 is preferably a laminate of two or more layers.

In a case where the phase difference layer 14 is a laminate of two or more layers, the slow axis when the plurality of layers are regarded as one layer may be arranged at 45°±10° with the transmission axis of the polarizer 12. For example, even in a case where a polarizer, a λ/2 plate, and a λ/4 plate are laminated in this order, this laminate can be regarded as a laminate of the polarizer and the phase difference layer described above. In this case, the polarizer, the λ/2 plate, and the λ/4 plate may be arranged such that the slow axis of the λ/2 plate is at 12.5°+10° and the slow axis of the λ/4 plate is at 72.5°±10° with respect to the transmission axis of the polarizer, and in a case where the polarizer, the λ/2 plate, and the 214 plate are arranged at these angles, the angle of the slow axis of the phase difference layer can be considered to be 45°±10° with respect to the absorption axis of the polarizer. That is, in this case, it is sufficient that the polarizer, the λ/2 plate, and the λ/4 plate are combined to form a circularly polarizing plate as a whole.

In addition, as necessary, the phase difference layer 14 may be formed on a substrate such as a glass substrate and a resin film. Further, the phase difference layer 14 may be formed on an alignment film formed on the substrate, as necessary.

The phase difference layer 14 is preferably a 2I4 film (2I4 plate). Particularly, the 2I4 film more preferably includes one or more layers of phase difference films including at least one liquid crystal compound formed by polymerizing a liquid crystal monomer exhibiting a phase difference film, a nematic liquid crystal layer, or a smectic liquid crystal layer. Among these, the phase difference layer 14 is even more preferably a 2I4 film formed of a polymerizable liquid crystal compound. The phase difference film may be optically substantially uniaxial or substantially biaxial. Examples of the liquid crystal compound include a disk-like liquid crystal compound and a rod-like liquid crystal compound.

With regard to the phase difference film, it is possible to select a phase difference film that is stretched in a transport direction, is stretched in a direction perpendicular to the transport direction, or is stretched at 45° with respect to the transport direction at the time of film production. In consideration of productivity, a phase difference film obtained by stretching a cyclic polyolefin resin (norbornene-based resin) or the like capable of preparing an optical sheet member by a so-called roll-to-roll process at 45°, or a film having a layer obtained by subjecting a transparent film to an alignment treatment, and aligning a liquid crystal compound on the treated surface in a direction of 45° with respect to the transport direction at the time of film production is preferable.

(A-Plate, B-Plate, and C-Plate)

In the present specification, the definition of an A-plate is as follows.

There are two kinds of A-plates: a positive A-plate (positive A-plate, +A-plate) and a negative A-plate (negative A-plate, −A-plate). When the refractive index in the in-plane slow axis direction of the film (the direction in which the refractive index becomes the maximum in the plane) is nx, the refractive index in a direction orthogonal to the in-plane slow axis in the plane is ny, and the refractive index in the thickness direction is nz, the positive A-plate satisfies the relationship of Expression (A1), and the negative A-plate satisfies the relationship of Expression (A2). Rth of the positive A-plate has a positive value and Rth of the negative A-plate has a negative value.

$$nx > ny \approx nz \qquad \text{Expression (A1)}$$

$$ny < nx \approx nz \qquad \text{Expression (A2)}$$

The term "≈" includes not only a case in which both are completely the same but also a case in which both are substantially the same. Regarding the term "substantially the same", for example, a case where (ny−nz)×d is −10 to 10 nm, and preferably −5 to 5 nm is also included in the term "ny≈nz", and a case where (nx−nz)×d is −10 to 10 nm and preferably −5 to 5 nm is also included in the term "nx≈nz". In this equation, d represents the thickness of the film.

All values of nx, ny, and nz of a B-plate are different and there are two kinds of B-plates; a B-plate having a negative Rth value satisfying the relationship of Expression (B1) and a B-plate having a positive Rth value satisfying the relationship of Expression (B2).

$$(nx+ny)/2 > nz \qquad \text{Expression (B1)}$$

$$(nx+ny)/2 < nz \qquad \text{Expression (B2)}$$

There are two kinds of C-plates: a positive C-plate (positive C-plate, +C-plate) and a negative C-plate (negative C-plate, −C-plate). The positive C-plate satisfies the relationship of Expression (C1), and the negative C-plate satisfies the relationship of Expression (C2). Rth of the positive C-plate has a negative value and Rth of the negative C-plate has a positive value.

$$nz > nx \approx ny \qquad \text{Expression (C1)}$$

$$nz < nx \approx ny \qquad \text{Expression (C2)}$$

The term "≈" includes not only a case in which both are completely the same but also a case in which both are substantially the same. Regarding the term "substantially the same", for example, a case where (nx−ny)×d is 0 to 10 nm and preferably 0 to 5 nm is also included in the term "nx≈ny". In this equation, d represents the thickness of the film.

(Reciprocal Wavelength Dispersibility)

From the viewpoint of reducing the tint of reflection, Re of the phase difference layer 14 preferably exhibits reciprocal wavelength dispersibility. The reciprocal wavelength dispersibility refers to a relationship of Re(450)<Re(550)<Re(650).

Specifically, the ratio of Re(450)/Re(550) is preferably in a range of 0.8 to 0.9 and the ratio of Re(650)/Re(550) is preferably in a range of 1.03 to 1.25.

In addition, with regard to the C-plate described later, "the C-plate exhibits reciprocal wavelength dispersibility" refers to a relationship of Rth(450)<Rth(550)<Rth(650).

(Optical Properties of Phase Difference Layer)

The phase difference layer 14 may be optically uniaxial or biaxial.

Since the absolute value of Rth(550) is increased by using the biaxial phase difference layer 14 (B-plate), the number of spiral turns of the cholesteric liquid crystal in the circularly polarized light separating layer 16 described later is increased and thus the brightness of blue light can be increased (the irradiation amount of blue light (the amount of blue light) is increased).

On the other hand, in a case of using the biaxial phase difference layer 14, an antireflection function in the oblique direction is reduced due to an increase in the absolute value of Rth(550), and further, the color balance of the display may be lost.

Accordingly, whether or not the phase difference layer 14 is uniaxial or biaxial may be appropriately selected according to the properties required for the organic EL display device 10. According to the investigation of the present inventors, from the viewpoint of the overall balance of the brightness of blue light, the oblique antireflection properties, and the color balance of the display, the phase difference layer 14 is preferably uniaxial (A-plate).

[Circularly Polarized Light Separating Layer]

Although described later, the circularly polarized light separating layer 16 is a cholesteric liquid crystal layer. The cholesteric liquid crystal layer is a layer having a cholesteric liquid crystal structure formed by fixing a cholesteric liquid crystalline phase.

The circularly polarized light separating layer 16 may be formed on a substrate such as a glass substrate and a resin film as necessary. Further, as necessary, the circularly polarized light separating layer 16 may be formed on an alignment film formed on a substrate.

(Cholesteric Liquid Crystal Structure)

A cholesteric liquid crystal structure is known to exhibit selective reflectivity at a specific wavelength. The selective reflection center wavelength depends on the pitch P of the spiral structure (=period of spiral) in the cholesteric liquid crystal structure, and follows the relationship of the average refractive index n of the liquid crystal compound forming the cholesteric liquid crystal structure and $\lambda=n\times P$. Therefore, the reflection center wavelength can be adjusted by adjusting this pitch of the spiral structure. Specifically, one pitch of the spiral structure in the cholesteric liquid crystal structure is the length of the cholesteric liquid crystal layer in the thickness direction in a case where the direction of the director of the liquid crystal compound forming the cholesteric liquid crystal structure is rotated by 360°.

Since the pitch of the cholesteric liquid crystal structure depends on the kind of chiral agent used together with a polymerizable liquid crystal compound in a case of forming the circularly polarized light separating layer 16, or the concentration of addition of the chiral agent, a desired pitch can be obtained by adjusting the kind of chiral agent and the concentration.

Regarding the adjustment of the pitch, a detailed description is given in Fuji Film Research & Development, No. 50 (2005), p. 60 to 63. Regarding the method for measuring the sense or pitch of a spiral, the methods described in "Ekisho Kagaku Jikken Nyumon (Introduction to Experiments in Liquid Crystal Chemistry)", edited by Japanese Liquid Crystal Society, published by Sigma Shuppan K. K., 2007, p. 46; and "Ekisho Benran (Handbook of Liquid Crystals)", Editorial Committee for the Handbook of Liquid Crystals, Maruzen, Inc., p. 196, can be used.

The problem of the present invention is a problem found in a case of producing a cholesteric liquid crystal layer that selectively reflects blue light, but is a problem that occurs in a cholesteric liquid crystal layer in general. The present invention can be applicable regardless of the selective wavelength.

(Selective Reflection Center Wavelength)

In the present invention, the selective reflection center wavelength (the center wavelength of the selective reflection wavelength range) and the half-width of the circularly polarized light separating layer 16 (cholesteric liquid crystal layer) can be obtained as follows.

In a case where the transmission spectrum of the circularly polarized light separating layer is measured using a spectrophotometer UV3150 (manufactured by Shimadzu Corporation), the decreasing peak of the transmittance is observed in the selective reflection range. In a case where, in two wavelengths which have a transmittance of ½ of the height of the highest peak, a value of a wavelength on a short wavelength side is set to $\lambda 1$ nm, and a value of a wavelength on a long wavelength side is set to $\lambda 2$ nm, the selective reflection center wavelength and a half-width $\Delta\lambda$ can be represented by the following expressions.

Selective reflection center wavelength=$(\lambda 1+\lambda 2)/2$

Half-width=$(\lambda 2-\lambda 1)$

The cholesteric liquid crystal structure gives a striped pattern of bright parts and dark parts in a cross-sectional image vertical to the formation surface of the circularly polarized light separating layer 16 as measured by a scanning electron microscope (SEM). Two repeated sets of the bright parts and the dark parts (three bright parts and two dark parts) correspond to one pitch of the spiral (one spiral turn). From this, the number of spiral turns of the cholesteric liquid crystal layer can be measured from a SEM cross-sectional view. The normal line of each line of the striped pattern is the direction of the spiral axis of the cholesteric liquid crystal structure.

(Method for Preparing Cholesteric Liquid Crystal Structure)

The cholesteric liquid crystal structure can be obtained by fixing a cholesteric liquid crystalline phase. The structure in which a cholesteric liquid crystalline phase is fixed may be a structure in which the alignment of the liquid crystal compound that forms the cholesteric liquid crystalline phase is retained, and typically, the structure may be a structure in which a layer lacking fluidity is formed by bringing a polymerizable liquid crystal compound into an aligned state of the cholesteric liquid crystalline phase and then polymerizing and curing the polymerizable liquid crystal compound by ultraviolet irradiation, heating or the like, and simultaneously the state is changed into a state that is free of any factor causing a change in the alignment state by an external field or an external force. Meanwhile, in the structure obtained by fixing the cholesteric liquid crystalline phase, it is sufficient that the optical properties of the cholesteric liquid crystalline phase are retained, and the liquid crystal compound may not exhibit liquid crystallinity any longer. For example, the polymerizable liquid crystal compound may be macromolecularized by a curing reaction and thereby may no longer have liquid crystallinity.

The material used for forming the cholesteric liquid crystal structure may be a liquid crystal composition including a liquid crystal compound. The liquid crystal compound is preferably a polymerizable liquid crystal compound.

The liquid crystal composition including a polymerizable liquid crystal compound further includes a surfactant, a chiral agent, a polymerization initiator, and the like. Examples of the surfactant, the chiral agent, and the polymerization initiator include compounds described in JP2016-197219A.

The polymerizable liquid crystal compound may be a rod-like liquid crystal compound or a disk-like liquid crystal compound. As described above, it is preferable that the phase difference layer 14 has reciprocal wavelength dispersibility, and from the viewpoint of being capable of suitably setting the total retardation Rth(550) in the thickness direction of members arranged between the polarizer 12 and the organic EL light emitting element 18 described later in a case where the reciprocal wavelength dispersibility of the phase difference layer 14 is used, a disk-like liquid crystal compound is suitably used.

Examples of the polymerizable group include an acryloyl group, a methacryloyl group, an epoxy group, and a vinyl group. The alignment of the liquid crystal compound can be fixed by curing the polymerizable liquid crystal compound. The liquid crystal compound having a polymerizable group is preferably a monomer or a relatively low molecular weight liquid crystal compound having a degree of polymerization of less than 100 is preferable.

(Disk-Like Liquid Crystal Compound)

Examples of the disk-like liquid crystal compound include compounds described in JP2007-108732A, JP2010-244038A, JP2013-195630A, JP1998-307208A (JP-H10-307208A), and JP2000-171637A. Generally, in JP2013-195630A, it is described that the disk-like liquid crystal compound is preferably a compound having a triphenylene structure. On the other hand, since a disk-like liquid crystal compound having a tri-substituted benzene structure has a higher Δn than a disk-like liquid crystal compound having a triphenylene structure, and the selective reflection wavelength range can be widened, the compound can be appropriately selected as necessary.

(Rod-Like Liquid Crystal Compound)

As the rod-like liquid crystal compound, azomethines, azoxys, cyanobiphenyls, cyanophenyl esters, benzoic acid esters, cyclohexanecarboxylic acid phenyl esters, cyanopheny lcy clohexanes, cyano-substituted phenylpyrimidines, alkoxy-substituted phenylpyrimidines, phenyldioxanes, tolanes, and alkenylcyclohexylbenzonitriles are preferably used.

As the rod-like liquid crystal compound which is a polymerizable liquid crystal compound, compounds described in Makromol. Chem., Vol. 190, p. 2255 (1989), Advanced Materials, Vol. 5, p. 107 (1993), U.S. Pat. Nos. 4,683,327A, 5,622,648A, 5,770,107A, WO95/022586A, WO95/024455A, WO97/000600A, WO98/023580A, WO98/052905A, JP1989-272551A (JP-H01-272551A), JP1994-016616A (JP-H06-016616A), JP1995-110469A (JP-H07-110469A), JP1999-080081A (JP-H11-080081A), and JP2001-064627A. Further, as the rod-like liquid crystal compound, for example, compounds described in JP1999-513019A (JP-H11-513019A) and JP2007-279688A can be preferably used.

(Number of Spiral Turns (Number of Spiral Pitches) of Circularly Polarized Light Separating Layer)

In the circularly polarized light separating layer 16 which is a cholesteric liquid crystal layer, the reflectivity of blue light (selective reflection wavelength range) is affected by the number of spiral turns. Specifically, as the number of spiral turns of the cholesteric liquid crystal layer increases, the reflectivity of blue light increases, and thus the brightness of blue light can be increased.

On the other hand, in the circularly polarized light separating layer 16 (cholesteric liquid crystal layer), as the number of spiral turns increases, the absolute value of Rth(550) of the circularly polarized light separating layer 16 increases. As will be described later, in the organic EL display device according to the embodiment of the present invention, the total of Rth(550) of members provided between the polarizer 12 and the organic EL light emitting element 18 is preferably −50 to 50 nm.

Accordingly, the number of spiral turns in the circularly polarized light separating layer 16 may be appropriately set according to the brightness of blue light required, Rth(550) of members provided between the polarizer 12 and the organic EL light emitting element 18, and the like.

From the viewpoint of while maintaining the blue light reflectivity of the circularly polarized light separating layer 16, optimizing Rth(550) of the circularly polarized light separating layer 16, the number of spiral turns of the cholesteric liquid crystal layer is preferably 1.5 to 6.5 pitches (1.5 to 6.5). The control of the number of spiral turns can be performed by controlling the film thickness of the circularly polarized light separating layer 16. In consideration of this point, the film thickness of the circularly polarized light separating layer 16 is preferably 0.4 to 1.8 μm and more preferably 0.8 to 1.3 μm.

(Re of Circularly Polarized Light Separating Layer)

In the organic EL display device 10 (optical laminate film) of the embodiment of the present invention, the circularly polarized light separating layer 16, which is a cholesteric liquid crystal layer, generates Re(550) in the plane.

In the present invention, "ReMAX [nm]" corresponding to the maximum value of Re(550) of the circularly polarized light separating layer that periodically changes with changes in the film thickness is defined by the following equation.

"$Re\ \text{MAX}\ [nm] = k \times \Delta n \times \lambda / n\ (k=0.213)$"

Here, n represents the average refractive index of the liquid crystal compound forming the circularly polarized light separating layer 16, Δn represents the birefringence of the liquid crystal compound forming the circularly polarized light separating layer 16, and λ represents the selective reflection center wavelength of the circularly polarized light separating layer 16, respectively.

In addition, in the organic EL display device 10 (optical laminate film) according to the embodiment of the present invention, Re(550) of the circularly polarized light separating layer 16 satisfies the following relationship.

"$0.5 \times Re\ \text{Max} \leq Re(550) \leq Re\ \text{Max}$"

By adopting such a configuration in the present invention, provides an optical laminate film having excellent uniformity in reflection tint even in a large size (large area), and an organic EL display device having excellent uniformity in reflection tint when turned off even in a large area are realized.

The present inventors have repeated investigations for improving quality for a configuration in which a circularly polarized light separating layer is provided for improving brightness in an organic EL display device using an antireflection film including a polarizer and a phase difference layer. As a result, it has been found that when the organic EL display device is turned off, in a case of being viewed from the front, the reflection tint is not uniform and unevenness occurs. Furthermore, it has been found that this change in tint is caused by a change in Re(550) of the circularly polarized light separating layer 16, which periodically changes according to the film thickness of the circularly polarized light separating layer.

Figure 3:
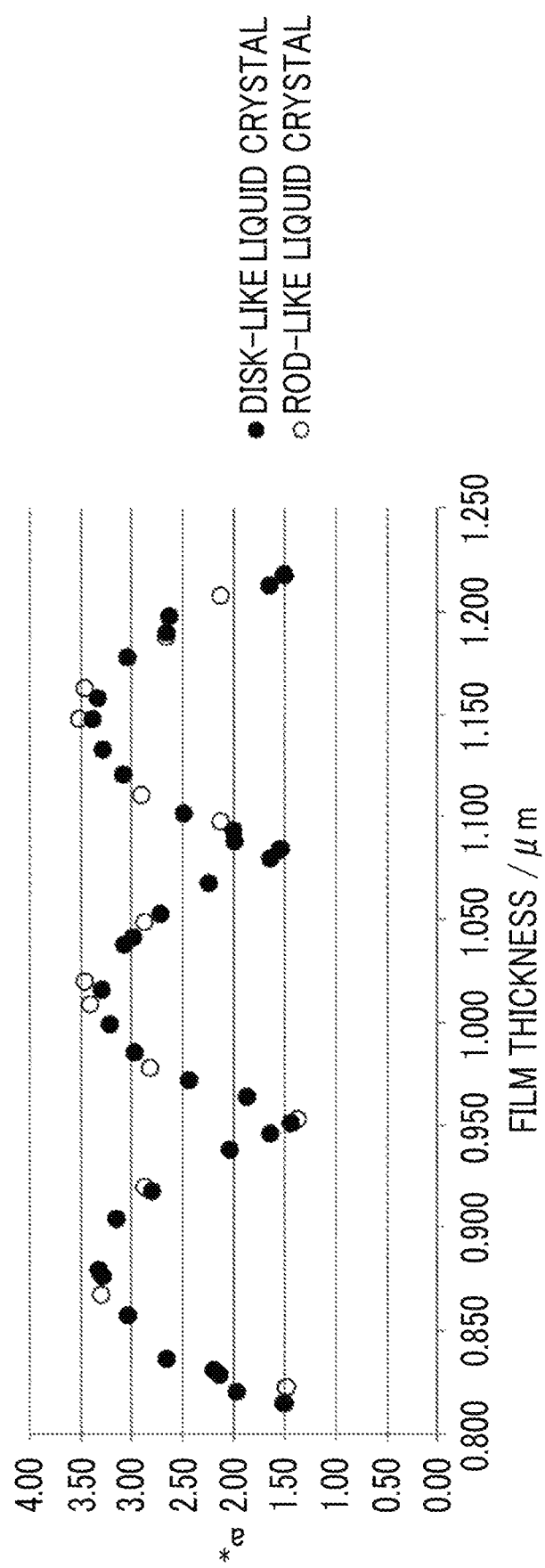
FIG. 3 is a graph showing that the tint periodically changes with respect to the film thickness of a circularly polarized light separating layer.

FIG. 3 shows an example of the relationship between the film thickness of the circularly polarized light separating layer (cholesteric liquid crystal layer) and chromaticity a* in a case where the organic EL display device is observed from the front when turned off in the organic EL display device including the polarizer, the phase difference layer, the circularly polarized light separating layer, and the organic EL light emitting element in this order. The details of FIG. 3 will be described later in Examples.

As shown in FIG. 3, the chromaticity a* in a case where the organic EL display device is observed from the front when turned off is gradually increased as the film thickness of the circularly polarized light separating layer is increased or decreased, and the tint is gradually decreased with a certain film thickness as the peak and is gradually increased with a certain film thickness as the lowest point. This change is periodically repeated according to the film thickness.

The reason for this change is that Re(550) of the circularly polarized light separating layer periodically changes according to the film thickness of the obtained circularly polarized light separating layer.

Figure 4:
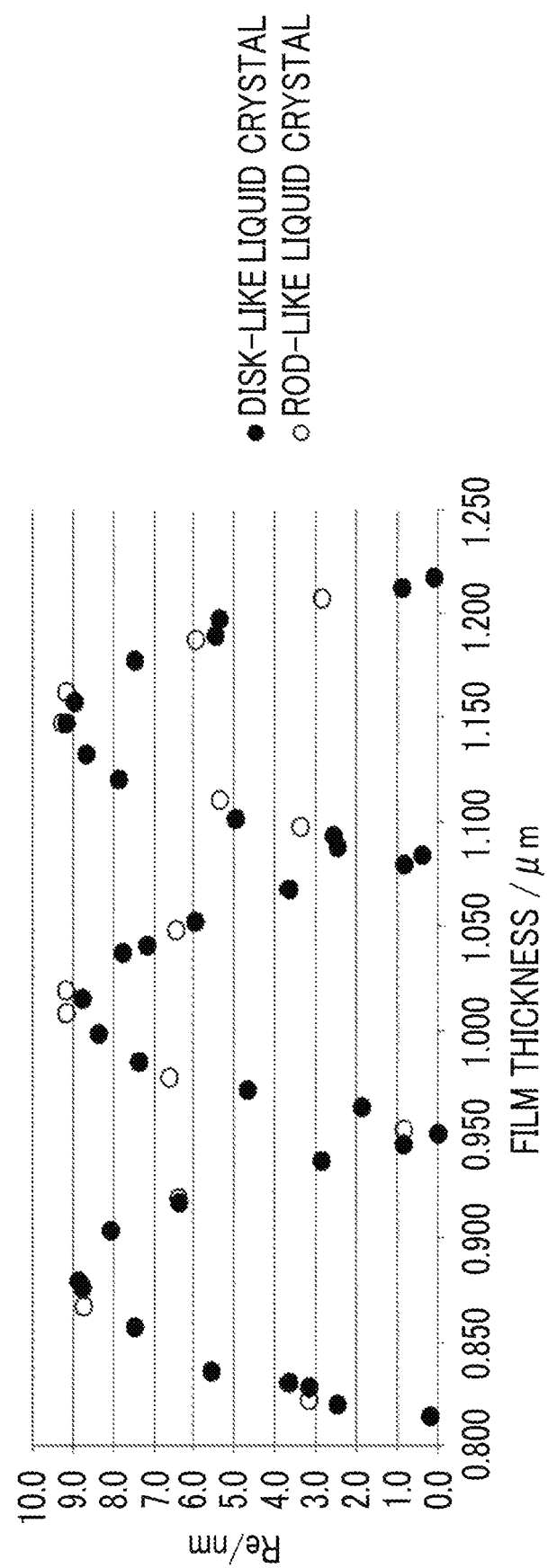
FIG. 4 is a graph showing that Re periodically changes with respect to the film thickness of the circularly polarized light separating layer.

FIG. 4 shows an example of the relationship between the film thickness of the circularly polarized light separating layer (cholesteric liquid crystal layer) constituting the organic EL display device in FIG. 3 and Re(550) of the circularly polarized light separating layer. The details of FIG. 4 will also be described later in Examples.

As shown in FIG. 4, Re(550) of the circularly polarized light separating layer is also gradually increased as the film thickness is increased or decreased, and Re(550) is gradually decreased with a certain thickness as the peak and is decreased with a certain thickness as the lowest point again. This change is periodically repeated according to the film thickness.

As shown in FIGS. 3 and 4, the thickness of the circularly polarized light separating layer at which the tint has the maximum value coincides with the thickness of the circularly polarized light separating layer at which Re(550) has the maximum value, and the thickness of the circularly polarized light separating layer at which the tint has the minimum value also coincides with the thickness of the circularly polarized light separating layer at which Re(550) has the minimum value. That is, the changes of the tint and Re(550) with respect to the thickness of the circularly polarized light separating layer are repeated at the same cycle according to a change in the film thickness.

This is due to the direction of the slow axis (director) of the liquid crystal compound located on the outermost surface of the circularly polarized light separating layer. The outermost surface of the circularly polarized light separating layer is the surface of the circularly polarized light separating layer opposite to the coating surface to which a liquid crystal composition to be the circularly polarized light separating layer is applied.

As described above, in the circularly polarized light separating layer, which is a cholesteric liquid crystal layer, the liquid crystal compound is spirally turned.

In the circularly polarized light separating layer, in a case where the liquid crystal compound is rotated by 360° on the outermost surface, Re(550) is zero. That is, in the circularly polarized light separating layer, in the cholesteric liquid crystal structure that is spirally turned, in a case where the direction of the slow axis of the liquid crystal compound on the lowermost surface coincides with the direction of the slow axis of the liquid crystal compound on the outermost surface, Re(550) is zero. Ideally, the thickness of the circularly polarized light separating layer, that is, the cholesteric liquid crystal layer formed by fixing the cholesteric liquid crystalline phase, is the thickness in a state in which the liquid crystal compound is rotated by 360°.

On the other hand, in a case where the film thickness of the circularly polarized light separating layer is increased from a state in which the liquid crystal compound is rotated by 360°, the liquid crystal compound that is spirally turned is placed thereon. The opposite is true in a case where the circularly polarized light separating layer is thin. As a result, the direction of the slow axis of the liquid crystal compound on the outermost surface of the circularly polarized light separating layer is shifted from the state in which the liquid crystal compound is rotated by 360°. Due to the shift of the slow axis of the liquid crystal compound from the state in which the liquid crystal compound is rotated by 360°, optical anisotropy occurs in the plane of the circularly polarized light separating layer.

As the shift of the slow axis of the liquid crystal compound from the state in which the liquid crystal compound is rotated by 360° becomes greater, the optical anisotropy in the plane of the circularly polarized light separating layer becomes greater and Re(550) increases. That is, in the circularly polarized light separating layer, Re(550) becomes maximum in a state in which the direction of the slow axis of the liquid crystal compound on the outermost surface is rotated by 90° from the state in which the direction of the slow axis of the liquid crystal compound is rotated by 360°. For example, in the example shown in FIG. 4, an Re(550) of about 9 nm at maximum is generated.

Further, since the direction of the slow axis of the liquid crystal compound coincides with the state in which the direction of the slow axis of the liquid crystal compound is rotated by 360° every time the liquid crystal compound on the outermost surface of the circularly polarized light separating layer is rotated by 180°, the in-plane optical anisotropy is canceled and Re(550) is zero. However, when the rotation is less than 180°, the in-plane optical anisotropy cannot be completely canceled, and Re(550) is generated.

That is, a period of an increase or decrease in Re(550) with respect to the film thickness of the circularly polarized light separating layer is almost equal to ½ of the spiral pitch of the cholesteric liquid crystal structure in the circularly polarized light separating layer (cholesteric liquid crystal layer).

Therefore, Re(550) of the circularly polarized light separating layer periodically changes according to the film thickness corresponding to ½ of the spiral pitch of the cholesteric liquid crystal structure.

It is considered that in the organic EL display device in which the circularly polarized light separating layer is combined with the antireflection film including the polarizer and the phase difference layer, Re(550), that is, the phase difference of the circularly polarized light separating layer thus generated affects the optical performance combined with the antireflection layer, which causes color unevenness when the organic EL display device is turned off.

That is, in the organic EL display device including the polarizer, the phase difference layer, the circularly polarized light separating layer, and the organic EL light emitting element in this order, the change in Re(550) corresponding to the thickness of the circularly polarized light separating layer corresponds to color unevenness to be improved when the organic EL display device is turned off, that is, non-uniformity in color when organic EL display device is turned off.

This problem remarkably occurs in a large image display device, particularly, a large image display device having a size of 50 inches or more, and particularly, an organic EL display device.

As described above, Re(550), that is, the tint of the circularly polarized light separating layer varies depending on the thickness of the circularly polarized light separating layer. Therefore, in order to produce an optical laminate film having a uniform tint, it is necessary to precisely control the film thickness of the circularly polarized light separating layer to be uniform over the entire area. However, in a large optical laminate film, it is difficult to make the film thickness of the circularly polarized light separating layer uniform over the entire surface, and a significant decrease in the yield causes a problem in production cost.

That is, as described above, the circularly polarized light separating layer is formed by a coating method. Therefore, in a case of a small circularly polarized light separating layer, a difference in film thickness over the entire surface is small, and uniformity in tint over the entire surface can be easily secured. However, in a case of a large (large area) optical laminate film, it is difficult to make the film thickness of the circularly polarized light separating layer uniform, and a gradual, large and wavy film thickness distribution is formed in film thickness of the circularly polarized light separating layer. As a result, in a case where the entire surface of the image display device is viewed when turned off, for example, a large difference in tint occurs at the center and the ends, between the ends, and the like.

Since a large image display device has a long viewing distance unlike a small image display device, fine color unevenness when turned off is not noticeable, but large wavy color unevenness when turned off is highly noticeable, which is a major factor causing degradation in quality.

In order to solve this problem, the present inventors performed a simulation based on the above considerations with the horizontal axis representing the film thickness (spiral pitch) of the circularly polarized light separating layer and the vertical axis representing Re(550). As a result, as shown by a broken line in FIG. 5, the obtained values almost coincided with the measured results shown in FIG. 4.

It was found that the region centered on the film thickness corresponding to 0.5×N+0.25 pitch (N is a natural number) is a stable region in which a change in Re(550) with respect to a change in the film thickness of the circularly polarized light separating layer is small. Specifically, the film thickness of the circularly polarized light separating layer varies to some extent in a direction of a coating width corresponding to, for example, 1400 mm, but by setting the center value of the film thickness to a film thickness corresponding to 0.5×N+0.25 pitch (N is a natural number and 6 to 15 are preferable), the variation of Re(550) in the coating width direction can be suppressed.

The present inventors have conceived of utilizing a stable region in which a change in Re(550) with respect to a change in the film thickness of the circularly polarized light separating layer 16 is small, and have completed the present invention.

That is, according to the present invention, in the optical laminate film including the polarizer 12, the phase difference layer 14, and the circularly polarized light separating layer 16 in this order, and in the organic EL display device 10 indulging the polarizer 12, the phase difference layer 14, the circularly polarized light separating layer 16, and the organic EL light emitting element 18 in this order, Re(550) of the circularly polarized light separating layer 16 satisfies the following Expression (1) and preferably satisfies the following Expression (2).

$$0.5 \times ReMax \leq Re \leq ReMax \quad \text{Expression (1)}$$

$$0.7 \times ReMax \leq Re \leq ReMax \quad \text{Expression (2)}$$

As described above, ReMax represents the maximum value of Re(550) that periodically changes according to changes in the film thickness of the circularly polarized light separating layer 16. ReMax is proportional to the birefringence Δn of the liquid crystal compound used for forming the circularly polarized light separating layer 16 and the spiral pitch film thickness of the circularly polarized light separating layer 16. The spiral pitch film thickness is a film thickness of one spiral pitch in which the slow axis (director) of the liquid crystal compound is rotated by 360° in the cholesteric liquid crystal structure described above.

As described above, the spiral pitch film thickness of the circularly polarized light separating layer 16 is represented by "λ/n" in a case where the selective reflection center wavelength of the circularly polarized light separating layer 16 (cholesteric liquid crystal layer) is λ, and the average refractive index of the liquid crystal compound forming the circularly polarized light separating layer 16 is n. Therefore, ReMax can be calculated by the following expression.

$$ReMAX = k \times \Delta n \times \lambda / n$$

Here, k is a proportional constant obtained by experiments and simulations and is "0.213".

By having such a configuration, in the present invention, a change in Re(550), that is, tint with respect to a change in the film thickness of the circularly polarized light separating layer 16 is suppressed and thus an optical laminate film having high uniformity in reflection tint and an organic EL display device having high uniformity in reflection tint when turned off are realized. The present invention utilizes a region in which Re(550) of the circularly polarized light separating layer 16 is large by constraint, and is disadvantageous in that the reflection tint is shifted from a designed value (intended tint) when the display device is turned off. However, in a large optical laminate film and a large organic EL display device mainly targeted by the present invention, the overall color unevenness has a greater adverse effect on quality than the shift of the reflection tint from the design value, and the quality improvement effect by eliminating unevenness in the overall reflection tint and improving the uniformity is very large.

In the present invention, a larger Δn has the merit that the film thickness of the circularly polarized light separating layer 16 can be reduced, and it is preferable to use a liquid crystal compound having a Δn of 0.1 to 0.2. In this case, ReMax is 6 to 12 nm.

In a case where the selective reflection center wavelength of the circularly polarized light separating layer 16 is increased, the spiral pitch film thickness of the circularly polarized light separating layer 16 is also proportionally increased, but the film thickness cycle at which Re(550) changes is also proportionally increased. Thus, the change rate of Re(550) with respect to the change in the film thickness of the circularly polarized light separating layer 16 depends on Δn.

In a case where Re(550) of the circularly polarized light separating layer 16 is less than "0.5×ReMax", a change in Re(550), that is, tint with respect to a change in the film thickness of the circularly polarized light separating layer 16 is large, and thus an optical laminate film having high uniformity in reflection tint and an organic EL display device having high uniformity in reflection tint when turned off cannot be obtained.

On the other hand, the fact that Re(550) of the circularly polarized light separating layer 16 is more than "ReMax" is basically not possible, and in this case, it is considered that some trouble occurs.

As described above, in the present invention, Re(550) of the circularly polarized light separating layer 16 preferably satisfies "0.7×ReMax≤Re≤ReMax" and more preferably satisfies "0.8×ReMax≤Re≤ReMax".

In the present invention, Re(550) of the circularly polarized light separating layer 16 is obtained by equally dividing the display surface (optical laminate film) of the organic EL display device 10 into 25 regions 0 of 5×5 equally divided with five equal parts on the short side and five equal parts on the long side, and measuring Re(550) at the center part of each region as described above, and the maximum value of Re(550) and the minimum value of Re(550) may be in a range of "0.5"×ReMax≤Re≤ReMax".

As described above, the wavy color unevenness when the display device is turned off does not cause a problem in a small display device, but is a major factor causing deterioration in quality in a large display device.

In consideration of this point, it is preferable that the optical laminate film and the organic EL display device 10 according to the embodiments of the present invention correspond to a large size (large screen). Specifically, the size of the organic EL display device 10 according to the embodiment of the present invention is preferably 50 inches or more, more preferably 55 inches or more, and even more preferably 65 inches or more. That is, the optical laminate film according to the embodiment of the present invention preferably has a size corresponding to an image display device of these sizes.

(Angle Formed Between Slow Axis of Circularly Polarized Light Separating Layer and Slow Axis of Phase Difference Layer)

As described above, Re(550) is generated in the plane of the circularly polarized light separating layer 16. That is, the circularly polarized light separating layer 16 has an in-plane phase difference. Therefore, the circularly polarized light separating layer 16 has a slow axis in the plane.

The change in the tint of the organic EL display device when turned off due to the generation of Re(550) in the circularly polarized light separating layer significantly varies at the angle formed between the slow axis of the circularly polarized light separating layer 16 and the slow axis of the phase difference layer 14.

Specifically, by setting the angle between the slow axis of the circularly polarized light separating layer 16 and the slow axis of the phase difference layer 14 to be −25° to 25°, the influence of the tint difference can be further suppressed. The angle formed between the slow axis of the circularly polarized light separating layer 16 and the slow axis of the phase difference layer 14 is more preferably −20° to 20° and even more preferably −10° to 10°.

The angle formed between the slow axis of the circularly polarized light separating layer 16 and the slow axis of the phase difference layer 14 shows a state in which the slow axis of the circularly polarized light separating layer 16 is clockwise with respect to the slow axis of the phase difference layer 14 as a positive value when the optical laminate film in which the polarizer 12, the phase difference layer 14 and the circularly polarized light separating layer 16 are laminated is viewed from the circularly polarized light separating layer 16 side.

In the present invention, particularly, in a case of a large display device as described above, a difference in the film thickness is generated in the plane of the circularly polarized light separating layer 16 and a variation occurs in the direction of the slow axis of the liquid crystal compound of the circularly polarized light separating layer 16. For this reason, in the present invention, the display surface (optical laminate film) of the organic EL display device 10 is equally divided into 25 regions of 5×5 equally divided into five equal parts on the short side and five equal parts on the long side, the angle formed between the slow axis of the circularly polarized light separating layer 16 and the slow axis of the phase difference layer 14 is measured at the center part of each region, and an average value of the maximum value and the minimum value of the angles formed between the slow axis of the circularly polarized light separating layer 16 and the slow axis of the phase difference layer 14 is used as the angle formed between the slow axis of the circularly polarized light separating layer 16 and the slow axis of the phase difference layer 14.

The slow axis of the circularly polarized light separating layer 16, that is, the cholesteric liquid crystal layer can be measured by AxoScan described above.

(Other Examples of Selective Reflection Center Wavelength of Circularly Polarized Light Separating Layer)

In the above example, the circularly polarized light separating layer 16 has the selective reflection center wavelength in a wavelength range of blue light, and preferably in a wavelength range of 430 to 480 nm, but the present invention is not limited thereto.

That is, for example, as the selective reflection center wavelength of the circularly polarized light separating layer 16 (cholesteric liquid crystal layer), various light wavelength ranges such as ultraviolet rays, green light, red light, and infrared rays can be used according to a color of which brightness is to be improved in the organic EL display device, a color of which the occurrence of tint in a case of oblique observation is to be suppressed, and the like.

As an example, a circularly polarized light separating layer 16 having a selective reflection center wavelength in a wavelength range of 700 to 800 nm is exemplified.

[Preferable Combination of Phase Difference Layer 14 and Circularly Polarized Light Separating Layer 16]

(Total of Rth of Members Provided Between Polarizer and Organic EL Light Emitting Element)

In the organic EL display device according to the embodiment of the present invention, the total (sum) of Rth(550) of members which are provided between the polarizer 12 and the organic EL light emitting element 18 is −50 to 50 nm (±50 nm). In other words, in the organic EL display device according to the embodiment of the present invention, the absolute value of the total of Rth(550) of members which are provided between the polarizer 12 and the organic EL light emitting element 18 is preferably 50 nm or less.

From the viewpoint of enhancing the antireflection function in the oblique direction, the total of Rth(550) of the members provided between the polarizer 12 and the organic EL light emitting element 18 is more preferably −40 to 40 nm, even more preferably −20 to 20 nm, and particularly preferably −10 to 10 nm.

Particularly, in a case where a C-plate is arranged between the polarizer 12 and the organic EL light emitting element 18, the total of Rth(550) of members which are provided between the polarizer 12 and the organic EL light emitting element 18 is preferably −20 to 20 nm and more preferably −10 to 10 nm.

That is, in the organic EL display device 10 shown in FIG. 1, the total of Rth(550) of the phase difference layer 14 and Rth(550) of the circularly polarized light separating layer 16 is preferably −50 to 50 nm.

With such a configuration, a good antireflection function in the oblique direction can be realized.

Accordingly, as one preferable combination of the phase difference layer 14 and the circularly polarized light separating layer 16, as described above, a combination of a +A-plate having reciprocal wavelength dispersibility, of which Rth(550) has a positive value, or a B-plate having reciprocal wavelength dispersibility, of which Rth(550) has a positive value, and a circularly polarized light separating layer 16 (cholesteric liquid crystal layer) that substantially functions as a +C-plate in the visible light range, has a negative Rth(550) value, and is formed of a disk-like liquid crystal compound is exemplified.

In addition, as another example of a preferable combination of the phase difference layer 14 and the circularly polarized light separating layer 16, as described above, a combination of a −A-plate having forward wavelength dispersibility, of which Rth(550) has a negative value, or a B-plate having forward wavelength dispersibility, of which Rth(550) has a negative value, and a circularly polarized light separating layer 16 (cholesteric liquid crystal layer) that substantially functions as a −C-plate in the visible light range, has a positive Rth(550) value, and is formed of a rod-like liquid crystal compound is exemplified.

(C-Plate Additionally Used As Necessary)

In the organic EL display device according to the embodiment of the present invention, since the total of Rth(550) of the members which are provided between the polarizer 12 and the organic EL light emitting element 18 is set to −50 to 50 nm and an antireflection function, particularly, an antireflection function in the oblique direction is achieved, as necessary, a C-plate may be added between the polarizer 12 and the organic EL light emitting element 18.

As described above, in the circularly polarized light separating layer 16 which is a cholesteric liquid crystal layer, as the number of spiral turns of the cholesteric liquid crystal layer increases, the reflectivity of blue light increases, and thus the brightness of blue light can increase.

In contrast, in a case where the number of spiral turns of the circularly polarized light separating layer 16 increases (for example, in a case where the number of spiral turns is 6 or more), the absolute value of Rth(550) of the circularly polarized light separating layer 16 increases and thus it becomes difficult to set the total of Rth(550) of the members, which are provided between the polarizer 12 and the organic EL light emitting element 18, in combination with the phase difference layer 14 to be in a range of −50 to 50 nm in some cases.

On the other hand, according to the combination of the phase difference layer 14 and the circularly polarized light separating layer 16, by providing a −C-plate of which Rth(550) has a positive value or a +C-plate of which Rth(550) has a negative value between the polarizer 12 and the organic EL light emitting element 18, regardless of Rth(550) of the phase difference layer 14 and the circularly polarized light separating layer 16, the total (sum) of Rth (550) of the members, which are provided between the polarizer 12 and the organic EL light emitting element 18, can be set to −50 to 50 nm.

As an example, as described above, in a case of using the phase difference layer 14 formed of the +A-plate having reciprocal wavelength dispersibility, of which Rth(550) has a positive value, or the B-plate having reciprocal wavelength dispersibility, of which Rth(550) has a positive value, and the circularly polarized light separating layer 16 (cholesteric liquid crystal layer) that substantially functions as a +C-plate in the visible light range, has a negative Rth(550) value, and is formed of a disk-like liquid crystal compound, a −C-plate of which Rth(550) has a positive value is provided between the polarizer 12 and the organic EL light emitting element 18.

In addition, as described above, in a case of using the phase difference layer 14 formed of the −A-plate having forward wavelength dispersibility, of which Rth(550) has a negative value, or the B-plate having forward wavelength dispersibility, of which Rth(550) has a negative value, and the circularly polarized light separating layer 16 that substantially functions as a −C-plate in the visible light range, has a positive Rth(550) value, and is formed of a rod-like liquid crystal compound, a +C-plate of which Rth(550) has a negative value is provided between the polarizer 12 and the organic EL light emitting element 18.

By using such a C-plate, the total of Rth(550) of members between the polarizer 12 and the organic EL light emitting element 18 can be adjusted with a high degree of freedom.

Therefore, by using the C-plate, the number of spiral turns of the circularly polarized light separating layer 16 is increased, the reflectivity of blue light is improved by the circularly polarized light separating layer 16, the brightness of blue light is sufficiently increased, and then the absolute value of the total of Rth(550) of members which are provided between the polarizer 12 and the organic EL light emitting element 18 is made very small. Thus, the antireflection function in the oblique direction can be improved.

That is, in the organic EL display device according to the embodiment of the present invention, in a case where there is no problem in the thickness of the organic EL display device, the complexity of the layer configuration between the polarizer 12 and the organic EL light emitting element 18, the cost, the productivity, and the like, from the viewpoint of performance, the configuration having the C-plate between the polarizer 12 and the organic EL light emitting element 18 is most advantageous.

In other words, from the viewpoints of the thickness of the organic EL display device, the simplicity of the layer configuration between the polarizer 12 and the organic EL light emitting element 18, the cost, the productivity, and the like, as in the organic EL display device 10 shown in FIG. 1, the configuration in which only the phase difference layer 14 and the circularly polarized light separating layer 16 are provided between the polarizer 12 and the organic EL light emitting element 18 is most advantageous.

Any known C-plate can be used as the C-plate. In addition, a commercially available optical film may be used as the C-plate.

The arrangement position of the C-plate is preferably between the phase difference layer 14 and the circularly polarized light separating layer 16 or between the circularly polarized light separating layer 16 and the organic EL light emitting element 18. Rth(550) of the C-plate is not limited, but in order not to cause tinting due to a phase difference, it is preferable that the absolute value of Rth(550) of the C-plate is 300 nm or less.

Further, the C-plate may be used in combination of a plurality of the same C-plate or different C-plates as necessary.

[Organic EL Light Emitting Element]

The organic EL light emitting element 18 displays an image by organic EL.

As an example, the organic EL light emitting element 18 is a known organic EL light emitting element constituting an organic EL light emitting device (OLED), such as an organic EL display or an organic illumination device, having a transparent electrode layer (thin film transistor (TFT)), a hole injection layer, a hole transport layer, an organic EL light emitting layer, a hole blocking layer, an electron transport layer, an electron injection layer, a cathode, and the like.

In addition, as the organic EL light emitting element 18, one obtained by removing an antireflection layer (antireflection film) from a known organic EL display, an organic EL display not having an antireflection layer, a known organic EL display, or the like can be used.

(Effect of Improving Brightness of Blue Light)

In the organic EL display device 10 according to the embodiment of the present invention as described above, the effect of improving the brightness of blue light is obtained by the following action.

Figure 2:
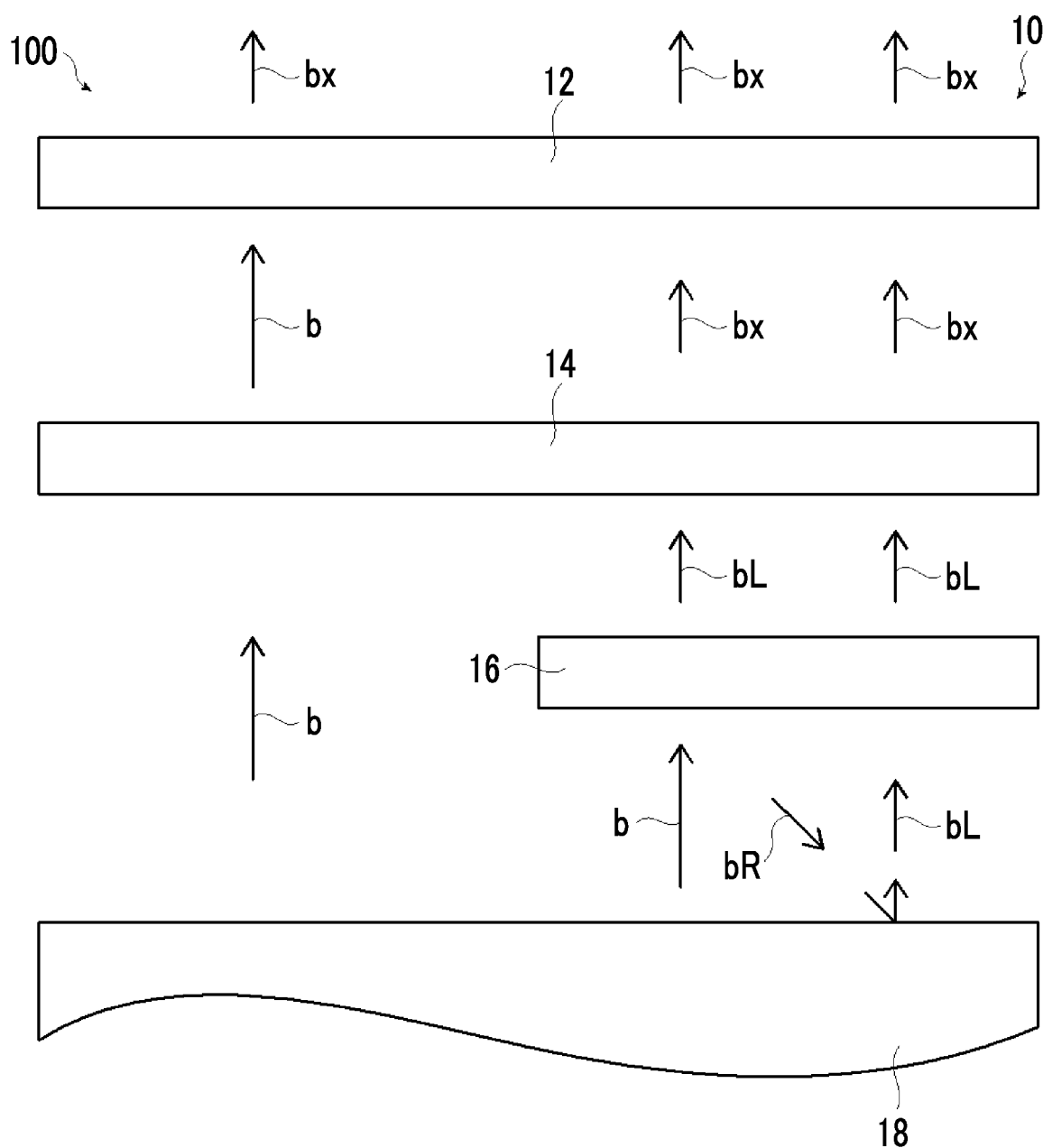
FIG. 2 is a conceptual view for describing the operation of the organic EL display device shown in FIG. 1.

FIG. 2 conceptually shows the organic EL display device 10 according to the embodiment of the present invention shown in FIG. 1 and an organic EL display device 100 of the related art in a disassembled state. As well known, the organic EL display device 100 of the related art also usually has a combination of the polarizer 12 and the phase difference layer 14 (λ/4 plate) as an antireflection film.

In the organic EL display device 100 of the related art, blue light b emitted by the organic EL light emitting element 18 is first made incident into the phase difference layer 14, is transmitted, and is then made incident into the polarizer 12. In FIG. 2, the length of the arrow of the blue light b represents light intensity (amount of light).

Since the polarizer 12 allows only transmission of linearly polarized light in a predetermined direction (referred to as the x direction), linearly polarized light in a direction orthogonal to the x direction is blocked by the polarizer 12. Accordingly, the blue light b transmitted through the polarizer 12 is only half linearly polarized blue light bx in the x direction.

In contrast, in the organic EL display device 10 according to the embodiment of the present invention, first, the blue light b emitted by the organic EL light emitting element 18 is made incident into the circularly polarized light separating layer 16. As an example, in a case where the circularly polarized light separating layer 16 (cholesteric liquid crystal layer) is a layer which reflects only right circularly polarized blue light bR, left circularly polarized blue light bL is transmitted and right circularly polarized blue light bR is reflected.

The left circularly polarized blue light bL transmitted through the circularly polarized light separating layer 16 is then made incident into the phase difference layer 14 (λ/4 plate), is transmitted, and then is converted into linearly polarized blue light bx in the x direction.

Next, the linearly polarized blue light bx is made incident into the polarizer 12. As described above, the polarizer 12 allows transmission of only linearly polarized light in the x direction. Accordingly, the linearly polarized blue light bx which is linearly polarized light in the x direction is transmitted through the polarizer 12 and is emitted.

On the other hand, the right circularly polarized blue light bR reflected by the circularly polarized light separating layer 16 is incident and reflected by the organic EL light emitting element 18 (the substrate of the light emitting element), the turning direction of the circularly polarized light is reversed, and the right circularly polarized blue light is converted into left circularly polarized blue light bL.

Next, although the left circularly polarized blue light bL reflected by the organic EL light emitting element 18 is made incident into the circularly polarized light separating layer 16, as described above, only the right circularly polarized blue light bR is reflected and thus the left circularly polarized blue light bL is transmitted through the circularly polarized light separating layer 16.

After this, as described above, the left circularly polarized blue light bL is then converted by the phase difference layer 14 into linearly polarized blue light bx which is linearly polarized light in the x direction, is then transmitted through the polarizer 12, which allows transmission of only linearly polarized light in the x direction, and is emitted.

That is, in the organic EL display device 10 according to the embodiment of the present invention having the circularly polarized light separating layer 16, by adjusting the direction of the circularly polarized light reflected by the circularly polarized light separating layer 16, the slow axis of the phase difference layer 14, and the transmission axis of the polarizer 12 such that the direction of the linearly polarized light emitted by the phase difference layer 14 coincides with the direction of the transmission axis of the polarizer 12, the amount of blue light about two times that of the organic EL display device of the related art can be emitted.

Accordingly, since the brightness of blue light about two times that of the organic EL display device of the related art can be emitted according to the organic EL display device 10 according to the embodiment of the present invention, an image display having high brightness can be obtained by improving the brightness of red light and green light together with blue light. In contrast, in a case where the display brightness may be the same as the display brightness of the organic EL display device of the related art, since the output of a blue light emitting source (organic EL light source for emitting blue light) can be reduced, the service life of the blue light emitting source can be extended and an organic EL display device 10 having high durability can be realized.

Such an effect is obtained similarly even in a case where the circularly polarized light separating layer 16 has a selective reflection center wavelength in the wavelength range of red light or in a case where the circularly polarized light separating layer 16 has a selective reflection center wavelength in the wavelength range of green light according to the color of the corresponding light.

EXAMPLES

Hereinafter, the present invention will be described in more detail with reference to Examples. However, the present invention is not limited thereto.

(Preparation of Temporary Support)

A triacetyl cellulose film (TAC film) having a thickness of 60 μm manufactured by Fujifilm Corporation was prepared.

On the other hand, the following alignment film coating liquid was prepared, dissolved by heating at 85° C. for 1 hour with stirring, and filtered with a 0.45 μm filter.

| Alignment film coating liquid | |
|---|---|
| PVA203 (polyvinyl alcohol manufactured by Kuraray Co., Ltd.) | 2.4 parts by mass |
| Pure water | 97.6 parts by mass |

The prepared alignment film coating liquid was applied onto the TAC film while adjusting the coating amount so that the film thickness after drying was 0.5 μm, and dried at 100° C. for 2 minutes.

The dried coating film was subjected to a rubbing treatment to prepare a film-like temporary support. The direction of the rubbing treatment was set to be parallel to the longitudinal direction of the film.

As a temporary support, in addition to the TAC film, it was confirmed that a normal polyethylene terephthalate film (PET film, for example, COSMOSHINE A4100, manufactured by Toyobo Co., Ltd.) could be used.

(Preparation of Coating Liquid A for Blue Light Reflection Circularly Polarized Light Separating Layer)

A coating liquid A for a circularly polarized light separating layer having the following composition was prepared, dissolved by heating at 25° C. for 1 hour, and filtered with a 0.45 μm filter. The following disk-like liquid crystal compound is a liquid crystal compound having an average refractive index n=1.678 and a birefringence Δn=0.156.

| Coating liquid A for circularly polarized light separating layer | |
| --- | --- |
| Disk-like liquid crystal compound (Compound 101) | 80 parts by mass |
| Disk-like liquid crystal compound (Compound 102) | 20 parts by mass |
| Additive 1 | 1.8 parts by mass |
| Additive 2 | 0.16 parts by weight |
| Additive 3 (F444, manufactured by DIC Corporation) | 0.5 parts by weight |
| Photopolymerization initiator 1 | 3 parts by mass |
| Chiral agent 1 | 5.18 parts by mass |
| Methyl ethyl ketone | 400 parts by mass |
| Cyclohexanone | 50 parts by mass |

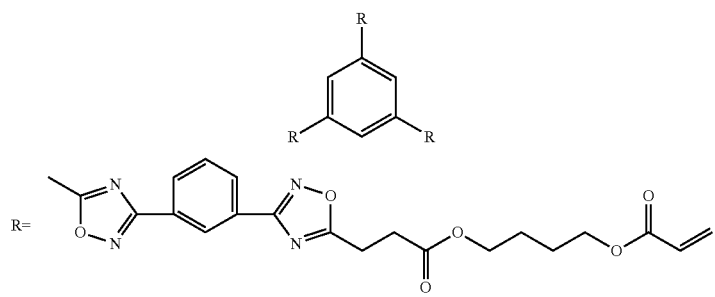

Compound 102

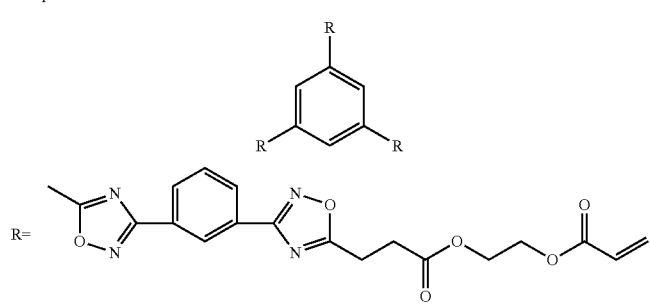

Additive 1

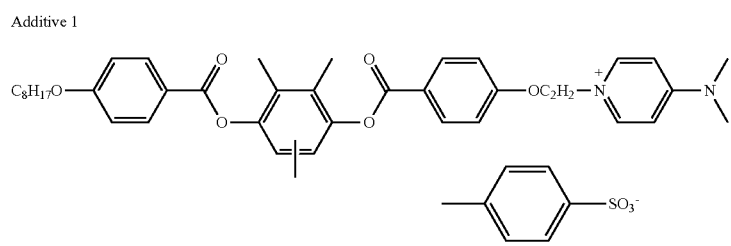

Additive 2

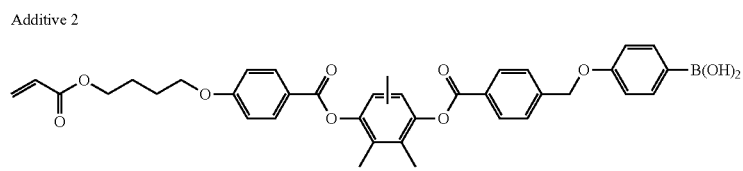

Chiral agent 1

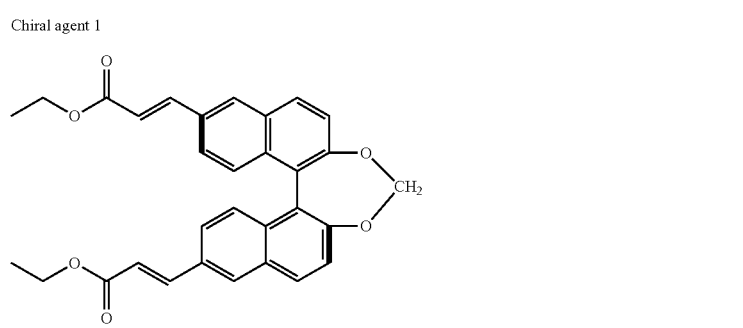

| Coating liquid A for circularly polarized light separating layer |
|---|

Photopolymerization initiator 1

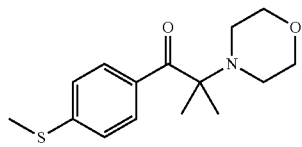

(Preparation of Circularly Polarized Light Separating Layer A)

The prepared coating liquid A for a circularly polarized light separating layer was applied to the rubbed surface of the temporary support using a Giesser (coating width: 1200 mm).

Subsequently, after the coating film was dried at 100° C. for 2 minutes and the solvent was evaporated, heat aging was performed at 115° C. for 3 minutes to obtain a homogeneously aligned state. Thereafter, the coating film was retained at 45° C. and was subjected to ultraviolet irradiation (300 mJ/cm$^2$) under a nitrogen atmosphere by using a high pressure mercury lamp to form a circularly polarized light separating layer (cholesteric liquid crystal layer) A reflecting right circularly polarized blue light.

The formed circularly polarized light separating layer A was cut into slits at an interval of a coating width of 10 mm. In the slits, samples having a substantially uniform thickness (within ±5 nm) was obtained.

The central slit was selected among the slits, and the cross section of the circularly polarized light separating layer A was observed by SEM. As a result, in the slit-shaped sample having a coating width of 10 mm cut out from the circularly polarized light separating layer having a coating width of 1200 mm, the film thickness of the central slit was 1.08 μm, and the number of spiral turns was 4.0 pitches. That is, the period of one pitch is 0.27 μm.

A glass substrate having a pressure sensitive adhesive layer formed on one surface was prepared.

The prepared circularly polarized light separating layer A side was bonded to the pressure sensitive adhesive layer side of this glass substrate, and the temporary support was peeled off.

As a result of measuring the phase difference of the circularly polarized light separating layer A with AxoScan, it was found that Re(550)/Rth(550)=0.6 nm/−53 nm. In addition, the wavelength (selective reflection center wavelength) at which the transmittance for light in the normal direction is minimum was 453 nm, and the transmittance thereof was 35%. In a case where the period of one pitch was calculated from (selective reflection center wavelength)/ (average refractive index), the period was 0.27 μm, which was confirmed to be consistent with the SEM observation described above.

Thus, it was confirmed that the circularly polarized light separating layer A reflected blue light and functioned as a +C-plate outside the selective reflection range.

(Preparation of Coating Liquid B for Blue Light Reflecting Circularly Polarized Light Separating Layer)

A coating liquid B for a circularly polarized light separating layer having the following composition was prepared. The following rod-like liquid crystal compound is a liquid crystal compound having an average refractive index n=1.678 and a birefringence Δn=0.160.

| Coating Liquid B for Circularly Polarized Light Separating Layer | |
|---|---|
| Mixture of rod-like liquid crystal compounds below | 100.0 parts by mass |
| Photopolymerization initiator 1 | 3.0 parts by mass |
| Chiral agent 2 | 6.6 parts by mass |
| Additive 4 | 0.095 parts by mass |
| Additive 3 (F444, manufactured by DIC Corporation) | 0.5 parts by weight |
| Methyl ethyl ketone | 400 parts by mass |
| Cyclohexanone | 50.0 parts by mass |

Rod-like liquid crystal compound

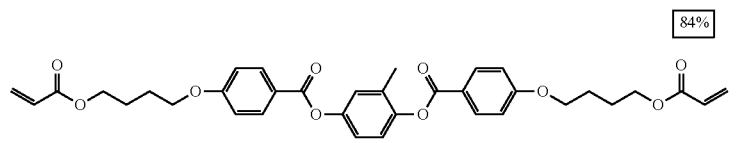

84%

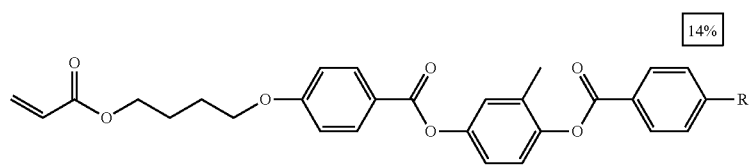

14%

| Coating Liquid B for Circularly Polarized Light Separating Layer |
|---|

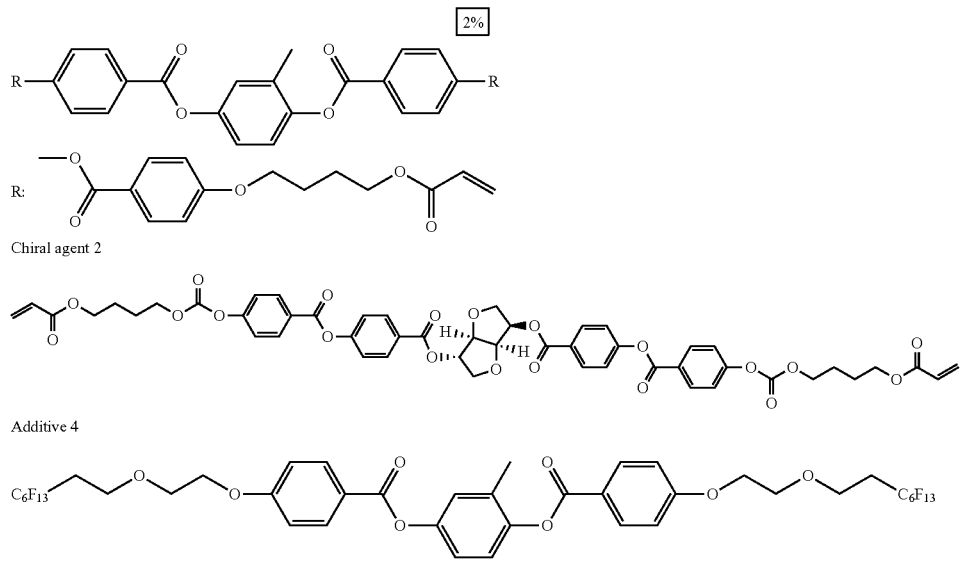

Chiral agent 2

Additive 4

(Preparation of Circularly polarized Light Separating Layer B)

The prepared coating liquid B for a circularly polarized light separating layer was applied to the rubbed surface of the temporary support using a Giesser (coating width: 1200 mm). Subsequently, after the coating film was dried at 95° C. for 1 minute, the coating film was subjected to ultraviolet irradiation (500 mJ/cm$^2$) at 25° C. by using a high pressure mercury lamp to form a circularly polarized light separating layer (cholesteric liquid crystal layer) B reflecting right circularly polarized blue light.

The formed circularly polarized light separating layer B was cut into slits at an interval of a coating width of 10 mm. Although there was a thickness difference between the slits, samples having a substantially uniform thickness (within ±5 nm) were obtained in the slits.

The central slit was selected among the slits, and the cross section of the circularly polarized light separating layer B was observed by SEM. As a result, in the slit-shaped sample having a coating width of 10 mm cut out from the circularly polarized light separating layer having a coating width of 1200 mm, the film thickness of the central slit was 1.09 μm, and the number of spiral turns was 4.0 pitches. That is, one pitch is 0.27 μm.

A glass substrate having a pressure sensitive adhesive layer formed on one surface was prepared.

The formed circularly polarized light separating layer B side was bonded to the pressure sensitive adhesive layer side of this glass substrate, and the temporary support was peeled off. As a result of measuring the phase difference of the circularly polarized light separating layer B with AxoScan, it was found that Re(550)/Rth(550)=0.7 nm/77 nm. In addition, the wavelength (selective reflection center wavelength) at which the transmittance for light in the normal direction is minimum was 454 nm, and the transmittance thereof was 35%. In a case where the period of one pitch was calculated from (selective reflection center wavelength)/ (average refractive index), the period was 0.27 μm, which was confirmed to be consistent with the SEM observation described above.

Thus, it was confirmed that the circularly polarized light separating layer B reflected blue light and functioned as a −C-plate outside the selective reflection range.

(Preparation of Phase Difference Layer)

A coating liquid for a phase difference layer having the following composition was prepared.

| Coating liquid for phase difference layer | |
|---|---|
| Liquid crystal compound L-3 below | 43.75 parts by mass |
| Liquid crystal compound L-4 below | 43.75 parts by mass |
| Polymerizable compound A-1 below | 12.50 parts by mass |
| Polymerization initiator S-1 (oxime type) below | 3.00 parts by mass |
| Leveling agent G-1 | 0.20 parts by mass |
| HISOLVE MTEM (manufactured by Toho Chemical Industry Co., Ltd.) | 2.00 parts by mass |
| NK ESTER A-200 (manufactured by Shin-Nakamura Chemical Co., Ltd.) | 1.00 part by mass |
| Methyl ethyl ketone | 424.8 parts by mass |

The group adjacent to the acryloyloxy group in the following liquid crystal compounds L-3 and L-4 represents a propylene group (a group in which a methyl group is substituted with an ethylene group), and the following liquid crystal compounds L-3 and L-4 each represent a mixture of positional isomers in which methyl group positions are different.

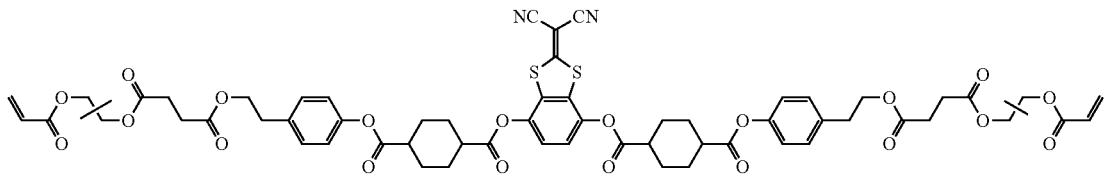

L-3

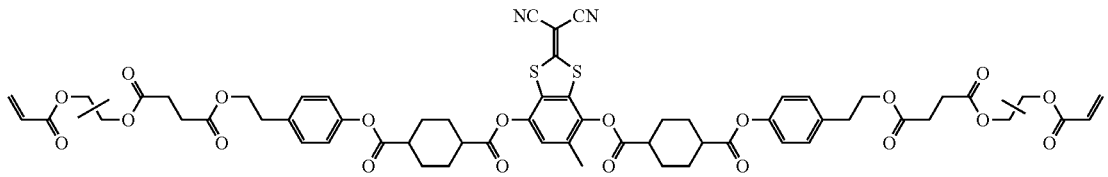

L-4

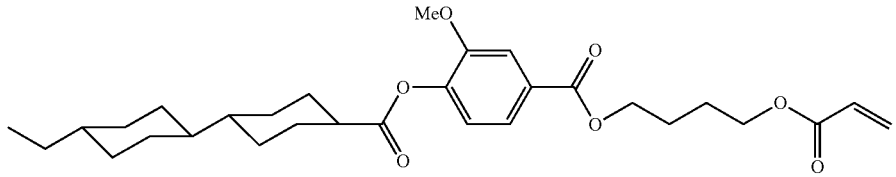

A-1

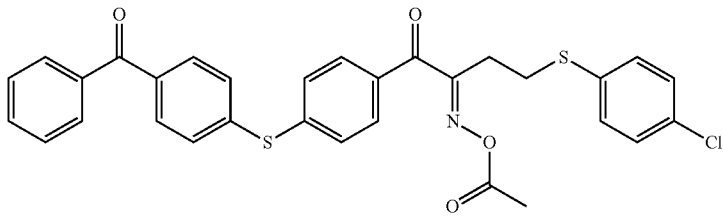

S-1

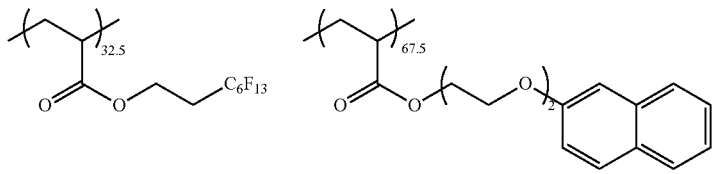

G-1

As a temporary support, a PET film (manufactured by FUJIFILM Corporation, thickness: 75 μm) having one surface subjected to a rubbing treatment was prepared. The rubbing direction was 45° with respect to the longitudinal direction of the PET film.

The prepared coating liquid for a phase difference layer was applied to the rubbed surface of the temporary support. Subsequently, after the coating film was dried at 90° C. for 2 minutes and the solvent was evaporated, heat aging was performed at 60° C. for 3 minutes to obtain a homogeneously aligned state. Then, the coating film was retained at 60° C. and was subjected to ultraviolet irradiation (500 mJ/cm$^2$) under a nitrogen atmosphere by using a high pressure mercury lamp to form a phase difference layer (optically anisotropic layer) having a film thickness of 2.0 mm.

A glass substrate having a pressure sensitive adhesive layer formed on one surface was prepared.

The formed phase difference layer was bonded to the pressure sensitive adhesive layer side of this glass substrate, and the temporary support was peeled off. As a resulting of measuring the phase difference of the phase difference layer with AxoScan, the following values were obtained. The measurement wavelengths used were 450 nm, 550 nm, and 650 nm.

TABLE 1

|  | 450 nm | 550 nm | 650 nm |
|---|---|---|---|
| Re/Rth(nm) | 119/60 | 140/70 | 147/74 |

The above table shows that Re and Rth at a wavelength of 450 nm were respectively 119 nm and 60 nm, Re and Rth at a wavelength of 550 nm were respectively 140 nm and 70 nm, and Re and Rth at a wavelength of 650 nm were respectively 147 nm and 74 nm.

Thus, it was confirmed that the phase difference layer was a λ/4 film of a +A-plate having reciprocal wavelength dispersibility. Hereinafter, the phase difference layer is also referred to as a λ/4 film.

(Preparation of Polarizer)

A TAC film (FUJITACK TD80UL, manufactured by Fujifilm Corporation) was immersed in a 1.5 N aqueous sodium hydroxide solution at 55° C. for 2 minutes, was washed in a water bath at room temperature, and was neutralized using 0.1 N sulfuric acid at 30° C. The neutralized TAC film was washed in a water-washing bath at room temperature again and further dried with hot air of 100° C. On the other hand, a roll was prepared by winding a polyvinyl alcohol film (PVA film) having a thickness of 80 μm. The PVA film was pulled out from the roll, continuously stretched 5 times in the longitudinal direction in an aqueous iodine solution, and dried to obtain a polarizer having a thickness of 20 µm.

The TAC film was bonded to only one side of the polarizer using a 3% aqueous solution of polyvinyl alcohol (PVA-117H, manufactured by Kuraray Co., Ltd.) as a pressure sensitive adhesive to prepare one side polarizer. The degree of polarization was 99.97% and the single plate transmittance was 43%.

Here, the degree of polarization and the single plate transmittance were measured using a spectrophotometer (VAP-7070, manufactured by JASCO Corporation).

(Production of Laminate Film)

A λ/4 film was laminated on the polarizer side of the one side polarizer such that the angle of the slow axis with respect to the transmission axis of the polarizer was 45°±10°.

Further, on the side where the λ/4 film was laminated, the circularly polarized light separating layer A was laminated such that the surface of the circularly polarized light separating layer A and the λ/4 film faced each other, and after lamination, the temporary support of the λ/4 film was peeled off to produce a laminate film. At this time, the angle formed between the rubbing direction of the alignment film in a case where the circularly polarized light separating layer A was formed and the slow axis of the λ/4 film was 45°+10°.

Similarly, a laminate film was produced for the circularly polarized light separating layer B.

In addition, each layer was bonded using a pressure sensitive adhesive (SK2057, manufactured by Soken Chemical Co., Ltd.). Regarding this point, the same applies to the following laminate films. This pressure sensitive adhesive is a substance having no refractive index anisotropy, and thus Rth is 0 nm.

(Preparation of Organic EL Display Device)

An organic EL television (OLED55B7P, 55 inches, manufactured by LG Electronics Inc.) was disassembled, and a part of the antireflection film stuck to the product was peeled off to obtain an organic EL light emitting element. This organic EL light emitting element was bonded to the produced laminate film using a pressure sensitive adhesive (SK2057, manufactured by Soken Chemical Co., Ltd.) to produce an organic EL display device. At this time, the laminate film was bonded such that the circularly polarized light separating layer side was the organic EL light emitting element side.

[Analysis of Reflection Chromaticity Difference When Turned Off (Preparation Example 1)]

With respect to the organic EL display device, a change in tint caused by the circularly polarized light separating layer (cholesteric liquid crystal layer) in a case where the display device was viewed from the front when turned off was confirmed and analyzed as follows.

Various circularly polarized light separating layers having different film thicknesses were formed in the same manner as the circularly polarized light separating layer A. Next, various laminate films were prepared in the same manner as the above-described laminate films using each of the formed circularly polarized light separating layers. Further, various organic EL display devices were prepared using the prepared laminate films in the same manner as in the preparation of the organic EL display device described above.

Regarding the prepared organic EL display device, the chromaticity a* in a case where the display device was from the front when turned off was measured, and as shown in FIG. 3, the relationship between the film thickness of the circularly polarized light separating layer and the chromaticity a* was graphed.

In addition, regarding the circularly polarized light separating layer B, similarly, various circularly polarized light separating layers having different film thicknesses were formed, similarly, a laminate film was prepared, and an organic EL display device was prepared. The relationship between the film thickness of the circularly polarized light separating layer and the chromaticity a* was detected and was also shown in the graph of FIG. 3.

In FIG. 3, a black circle (separating layer A) represents an organic EL display device using a circularly polarized light separating layer formed of a disk-like liquid crystal compound and corresponding to the circularly polarized light separating layer A, and a white circle (separating layer B) represents an organic EL display device using a circularly polarized light separating layer formed of a rod-like liquid crystal compound and corresponding to the circularly polarized light separating layer B.

The chromaticity was measured using a spectrophotometer (CM-2022, manufactured by Konica Minolta Inc.) under the conditions of D65, a viewing angle of 10°, and SCI.

As shown in FIG. 3, it was confirmed that a change in chromaticity when viewed from the front occurred according to a change in the film thickness of the circularly polarized light separating layer and periodically changed according to the film thickness, which is the subject of the present invention, and this period substantially matched with 0.135 µm, which is half of the spiral pitch of the circularly polarized light separating layer.

Thus, it can be confirmed as follows: every time the spiral pitch of the circularly polarized light separating layer is rotated by 180°, the optical anisotropy in the plane caused by the liquid crystal compound molecules is canceled and Re becomes zero; however, the in-plane optical anisotropy cannot be completely canceled when the rotation of the liquid crystal compound molecules is less than 180°, Re is thus generated, and Re generated in the circularly polarized light separating layer affects the optical performance combined with the antireflection layer including the polarizer and the phase difference layer to cause a change in the tint.

In addition, Re(550) of each circularly polarized light separating layer used in the organic EL display device was measured by AxoScan, and as shown in FIG. 4, the relationship between the film thickness of the circularly polarized light separating layer and Re(550) was graphed. As a result, it could be confirmed that Re(550) of the circularly polarized light separating layer periodically changed according to the film thickness of the circularly polarized light separating layer, and the periodic change coincided with the change in tint with respect to the film thickness.

In FIG. 4, a black circle (separating layer A) represents a circularly polarized light separating layer formed of a disk-like liquid crystal compound and corresponding to the circularly polarized light separating layer A, and a white circle (separating layer B) represents a circularly polarized light separating layer formed of a rod-like liquid crystal compound and corresponding to the circularly polarized light separating layer B.

From these results, it was found that ReMAX of the circularly polarized light separating layer A is 9.0 nm and ReMAX of the circularly polarized light separating layer B is 9.2 nm. Further, it could be confirmed that ReMax is equal to the value obtained from "ReMAX=k×Δn×λ/n (k=0.213)".

From this result, it was found that in a case where the film thickness of the circularly polarized light separating layer is shifted by about 60 nm, Re(550) is shifted by about 9 nm at the maximum, and a large tint difference is generated. That is, it was clearly shown that in a large area organic EL display device, it is a problem that the shift of Re(550) is reduced in order to secure the uniformity in reflection tint when turned off.

Figure 5:
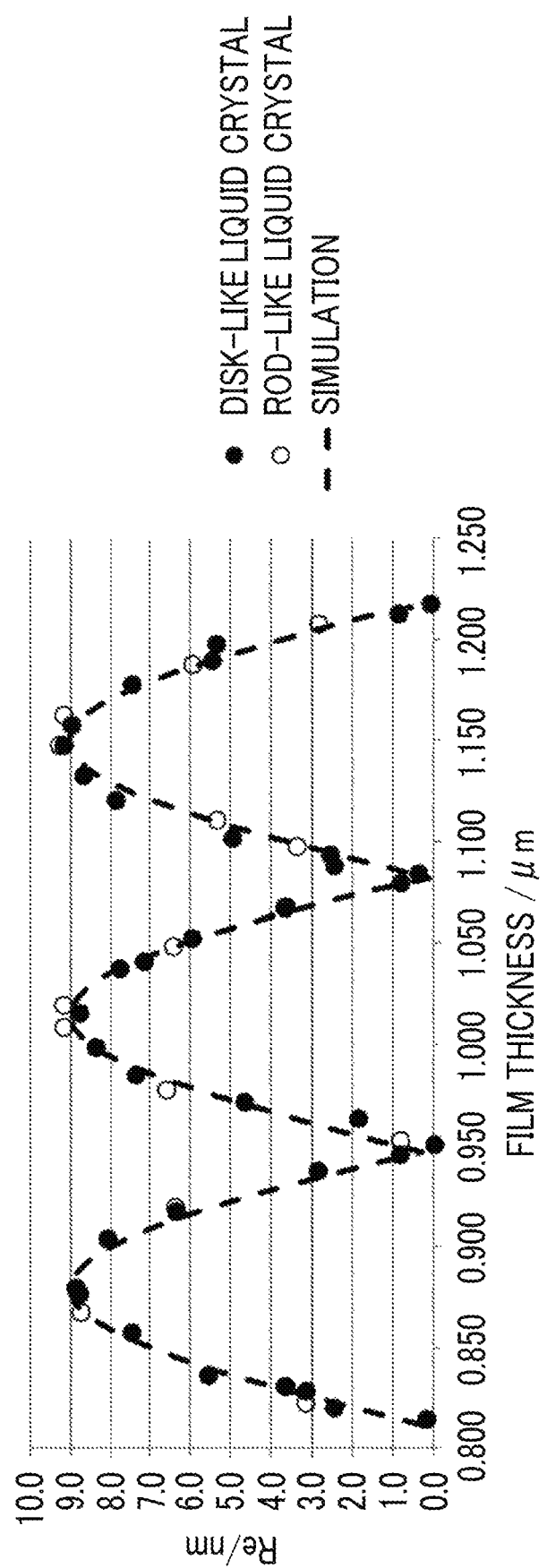
FIG. 5 is a graph showing that simulation results showing that Re periodically changes with respect to the film thickness of the circularly polarized light separating layer and actually measured values coincide with each other.

In addition, in a case where Re(550) generated in the circularly polarized light separating layer was simulated based on the above results, it could be confirmed that the data substantially coincided with the data as shown in FIG. 5. In a case where this data is examined in detail, it can be confirmed that a change in Re with respect to a change in the thickness of the cholesteric layer is small in a regions around 0.88 μm, 1.01 μm, and 1.15 μm.

In consideration of the spiral pitch of the circularly polarized light separating layer (cholesteric liquid crystal layer), it is found that in a region centered on a film thickness corresponding to 0.5×N+0.25 pitches (N is a natural number), a change in Re(550) to a change in film thickness is small.

That is, it can be confirmed that in a large organic EL display device, even in a case where the film thickness of the circularly polarized light separating layer varies to some extent, by setting the center value of the film thickness to a thickness corresponding to 0.5×N+0.25 pitches, the suppression of a variation in Re(550) can be realized. In this expression, N is a natural number and preferably 6 to 15.

It was considered that a macro change in Re(550) in the circularly polarized light separating layer is correlated with the direction of the director of the liquid crystal compound on the outermost surface of the circularly polarized light separating layer, and the direction of the director of the liquid crystal compound was measured by sum frequency generation spectroscopy (SFG) by selecting 9 points at equal intervals from a 40 mm×40 mm sample (Re(550) 7.1 nm, axis angle 64°) with uniform tint. However, unlike the expectation, the direction of the director of the liquid crystal compound was various (0°, 38°, 28°, 40°, 32°, 22°, 39°, 25° and 40° with respect to the rubbing direction), and at least no microscopic director direction agreement was found.

Preparation Examples 2 to 18

As in the cases of the circularly polarized light separating layer A and the circularly polarized light separating layer B, 55 inch size samples A1 to A10 and B1 to B3 having different average film thicknesses, variations in film thickness, and rubbing angles by using Giessers having different properties were prepared. However, only in sample A10 (Preparation Example 16), the content of chiral agent 1 was changed from 5.18 parts by mass to 3.03 parts by mass in the coating liquid A for a circularly polarized light separating layer used for forming the circularly polarized light separating layer A.

That is, the circularly polarized light separating layers of samples A1 to A10 are circularly polarized light separating layers formed of a disk-like liquid crystal compound (DLC), and the circularly polarized light separating layers of samples B1 to B3 are circularly polarized light separating layers formed of a rod-like liquid crystal compound (CLC).

For each sample, in the 5×5=25 region obtained by equally dividing the long side and the short side of the circularly polarized light separating layer into five equal parts, respectively, the film thickness, Re(550), the direction of the slow axis (in-plane slow axis), and the selective reflection center wavelength were measured at the center part of each region. The film thickness, Re(550), and the selective reflection center wavelength of the circularly polarized light separating layer were measured as described above.

Using these circularly polarized light separating layers, laminate films were prepared in the same manner as in the above example. For the prepared laminate films, the angle formed between the slow axis of the λ/4 film (phase difference layer) and the slow axis of the circularly polarized light separating layer was measured. In a case where the laminate film in which the polarizer, the phase difference layer and the circularly polarized light separating layer were laminated was viewed from the circularly polarized light separating layer side, the angle θ had a positive value clockwise with respect to the slow axis of the λ/4 film. Further, regarding the angle of the slow axis, the average value of the maximum value and the minimum value of the angles in the 25 regions of the circularly polarized light separating layer was used as the angle θ formed between the slow axis of the λ/4 film (phase difference layer) and the slow axis of the circularly polarized light separating layer. In addition, with respect to the λ/4 film, Re(550) was finely adjusted with the film thickness of the λ/4 film such that the tint in the region with the average film thickness in each sample of the circularly polarized light separating layer was black.

An organic EL display device was prepared as described above using the prepared laminate film.

In addition, only in Preparation Examples 14 and 15, a +C-plate (positive C-plate) was laminated between the circularly polarized light separating layer and the organic EL element. The +C-plate was bonded using (SK pressure sensitive adhesive, manufactured by Soken Chemical Co., Ltd.). Preparation Example 14 is the same as Preparation Example 9 and Preparation Example 15 is the same as Preparation Example 13 except that a +C-plate is provided.

The +C-plate was prepared as follows.

(Preparation of +C-Plate)

A temporary support having a PVA alignment film was prepared, and the PVA alignment film was subjected to a rubbing treatment. Thereafter, a coating liquid for a C-plate having the following composition was applied. The temporary support (including the alignment film) was peeled off when the above-described +C-plate was laminated.

After application, the coating was dried at 60° C. for 60 seconds and then irradiated with ultraviolet rays of 1000 mJ/cm² (i-line) in air using an air-cooled metal halide lamp (manufactured by Eye Graphic Co., Ltd.) at 70 mW/cm² (i-line) to fix the alignment state, and the polymerizable rod-like liquid crystal compound was vertically aligned to prepare a +C-plate.

Rth(550) of the prepared +C-plate was −115 nm. Rth(550) of the +C-plate was measured in the same manner as above.

| Coating liquid for C-plate | |
|---|---|
| Rod-like liquid crystal compound C1 | 80 parts by mass |
| Rod-like liquid crystal compound C2 | 20 parts by mass |
| Vertical alignment agent (S01) | 1 part by mass |
| Vertical alignment agent (S02) | 0.5 parts by mass |
| Ethylene oxide modified trimethylolpropane triacrylate (V#360, manufactured by Osaka Organic Chemical Industry Ltd.) | 8 parts by mass |
| IRGACURE 907 (manufactured by BASF SE) | 3 parts by mass |
| Kayacure DETX (manufactured by Nippon Kayaku Co., Ltd.) | 1 part by mass |
| Compound B01 | 0.4 parts by mass |
| Methyl ethyl ketone | 170 parts by mass |
| Cyclohexanone | 30 parts by mass |

Rod-like crystal compound C1

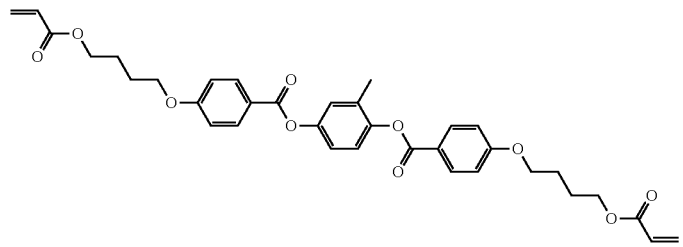

Rod-like liquid crystal compound C2

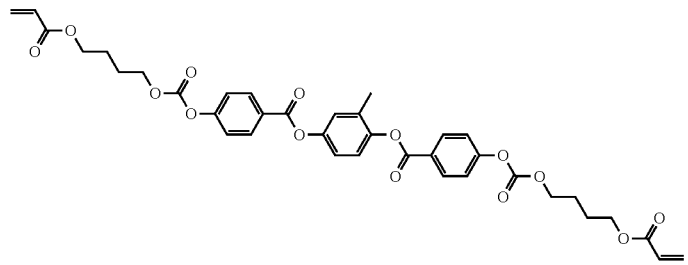

Vertical alignment agent (S01)

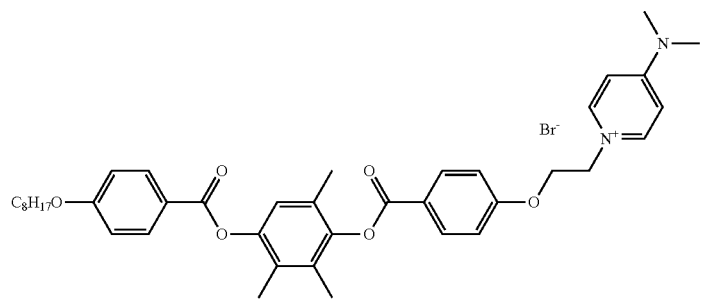

Vertical alignment agent (S02)

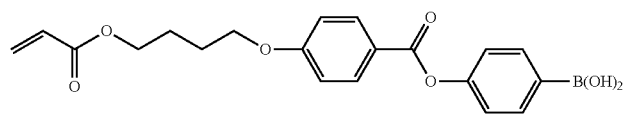

Compound B01

Regarding each of the prepared organic EL display devices, the reflection tint and the brightness improvement rate in a case where the display device was observed from the front when the display device was turned off were evaluated.

<Evaluation of Reflection Chromaticity Difference>

In a state where the organic EL display device was turned off, the chromaticity measurement was performed using a spectrophotometer (CM-2022, manufactured by Konica Minolta Inc.) under the conditions of D65, a viewing angle of 10°, and SCI, and further, sensory evaluation was performed by visual observation.

The chromaticity measurement was performed from the front direction (normal direction (polar angle 0°) at the center part of each region in the 25 regions of 5×5 obtained by equally dividing the short side and the long side of the 55 inch screen into five equal parts, respectively. With respect to Preparation Examples 9 and 13 to 15, the reflection chromaticity difference in a case of visual observation from the oblique direction (direction of a polar angle of 60°) was subjected to sensory evaluation.

The evaluation standards are as follows.

[Front Direction]

A: Each region of all of the 25 regions of the organic EL display device has a chromaticity difference (color difference) ΔE*ab of less than 0.5 with other 24 regions. In this case, no tint difference was visually recognized in the 25 regions of the organic EL display device.

B: One or more regions having a chromaticity difference ΔE*ab of 0.5 or more with other regions are present in the 25 regions of the organic EL display device, but a chromaticity difference ΔE*ab of all of the 25 regions with other 24 regions is less than 1.0. In this case, the tint difference in the 25 regions of the organic EL display device was not visually recognized unless carefully observed.

C: One or more regions having a chromaticity difference ΔE*ab of 1.0 or more with other regions are present in the 25 regions of the organic EL display device, but a chromaticity difference ΔE*ab of all of the 25 regions with other 24 regions is less than 2.0. In this case, the tint difference in the 25 regions of the organic EL display device was not noticeable, and thus is within the allowable range.

D: One region having of a chromaticity difference ΔE*ab of 2.0 or more with other regions is present in the 25 regions of the organic EL display device. In this case, the tint difference is noticeable in the 25 regions of the organic EL display device in a case of visual observation and is not allowable.

[Oblique Direction (Visual Sensory Evaluation)]p A: No tint difference is visually recognized in the 25 regions of the organic EL display device.

B: The tint difference in the 25 regions of the organic EL display device is not recognized unless the display device is carefully observed.

C: The tint difference is not noticeable in the 25 regions of the organic EL display device and thus is within an allowable range.

D: The tint difference is noticeable in the 25 regions of the organic EL display device and are not allowable.

(Brightness Improvement Rate)

For the evaluation of the brightness improvement rate, the maximum light amount in a wavelength range of 430 to 480 nm when the organic EL display device displayed blue was measured in the normal direction of the organic EL display device (blue light amount). In addition, the maximum light amount in a wavelength range of 700 to 800 nm when the organic EL display device displayed red was measured in the normal direction of the organic EL display device (red light amount).

The evaluation was performed using a relative value with the maximum light amount of an organic EL television (OLED 55B7P, 55 inches, manufactured by LG Electronics Inc.) as a product as 100%.

The details of the layer configuration and the evaluation results are shown in the following tables.

In each of Preparation Examples, for the film thickness and Re of the circularly polarized light separating layer, and the angle θ formed between the slow axis of the λ/4 film and the slow axis of the circularly polarized light separating layer, only the maximum value, the minimum value, and the average value of the maximum value and the minimum value are shown in the measured values in a total of 25 regions obtained by dividing the long side and the short side into five equal parts, respectively.

TABLE 2

| | | Circularly polarized light separating layer | | | | | | | | | | | | Evaluation | | | | |
|---|---|---|---|---|---|---|---|---|---|---|---|---|---|---|---|---|---|---|
| | | Film thickness [μm] | | | | Re[nm] | | | | Reflection center wavelength [nm] | Angle θ [°] | | | | | Reflection chromaticity difference | | Brightness improvement rate [%] | |
| | Sample name | Average value | Maximum | Minimum | Difference | Maximum | Minimum | Difference | ReMax | | Maximum | Minimum | Average value | C-plate | Total Rth [nm] | Front | Oblique | Blue light | Red light | Properties |
| Preparation Example 2 | A1(DLC) | 0.98 | 1.01 | 0.95 | 0.06 | 9.0 | 0.3 | 8.7 | 9.0 | 455 | 59 | 16 | 37.5 | Not provided | 22 | D | | 118 | 100 | Comparative Example |
| Preparation Example 3 | A2(DLC) | 1.01 | 1.06 | 0.97 | 0.09 | 9.0 | 4.6 | 4.4 | 9.0 | 455 | −31 | −89 | −60.0 | Not provided | 20 | C | | 118 | 100 | Example |
| Preparation Example 4 | A3(DLC) | 1.01 | 1.06 | 0.97 | 0.09 | 9.0 | 4.6 | 4.4 | 9.0 | 455 | 3 | −52 | −24.5 | Not provided | 20 | B | | 118 | 100 | Example |
| Preparation Example 5 | A4(DLC) | 1.01 | 1.06 | 0.97 | 0.09 | 9.0 | 4.6 | 4.4 | 9.0 | 455 | 33 | −24 | 4.5 | Not provided | 20 | A | | 117 | 100 | Example |
| Preparation Example 6 | A5(DLC) | 1.01 | 1.06 | 0.97 | 0.09 | 9.0 | 4.6 | 4.4 | 9.0 | 455 | 88 | 31 | 59.5 | Not provided | 20 | C | | 117 | 100 | Example |
| Preparation Example 7 | A6(DLC) | 1.01 | 1.04 | 0.98 | 0.06 | 9.0 | 6.5 | 2.5 | 9.0 | 455 | −38 | −81 | −59.5 | Not provided | 20 | B | | 118 | 100 | Example |
| Preparation Example 8 | A7(DLC) | 1.01 | 1.04 | 0.98 | 0.06 | 9.0 | 6.5 | 2.5 | 9.0 | 455 | −3 | −46 | −24.5 | Not provided | 20 | A | | 118 | 100 | Example |
| Preparation Example 9 | A8(DLC) | 1.01 | 1.04 | 0.98 | 0.06 | 9.0 | 6.5 | 2.5 | 9.0 | 455 | 45 | 3 | 24.0 | Not provided | 20 | A | B | 118 | 100 | Example |
| Preparation Example 10 | A9(DLC) | 1.01 | 1.04 | 0.98 | 0.06 | 9.0 | 6.5 | 2.5 | 9.0 | 455 | 79 | 40 | 59.5 | Not provided | 20 | B | | 117 | 100 | Example |
| Preparation Example 11 | B1(CLC) | 0.98 | 1.01 | 0.95 | 0.06 | 9.2 | 0.3 | 8.9 | 9.2 | 454 | 58 | 16 | 37.0 | Not provided | 120 | D | | 117 | 100 | Comparative Example |

TABLE 2-continued

| | | Circularly polarized light separating layer | | | | | | | | | | | | | Evaluation | | | | | |
|---|---|---|---|---|---|---|---|---|---|---|---|---|---|---|---|---|---|---|---|---|
| | | Film thickness [μm] | | | | Re[nm] | | | | Reflection center wavelength [nm] | Angle θ [°] | | | | | Total Rth [nm] | Reflection chromaticity difference | | Brightness improvement rate [%] | | Properties |
| | Sample name | Average value | Max-imum | Min-imum | Differ-ence | Max-imum | Min-imum | Differ-ence | ReMax | | Max-imum | Min-imum | Average value | C-plate | | Front | Oblique | Blue light | Red light | |
| Preparation Example 12 | B2(CLC) | 1.01 | 1.06 | 0.97 | 0.09 | 9.2 | 4.6 | 4.6 | 9.2 | 454 | 54 | -4 | 25.0 | Not provided | 120 | B | | 117 | 100 | Example |
| Preparation Example 13 | B3(CLC) | 1.01 | 1.04 | 0.98 | 0.06 | 9.2 | 6.5 | 2.7 | 9.2 | 454 | 46 | 3 | 24.5 | Not provided | 120 | A | C | 118 | 100 | Example |
| Preparation Example 14 | A8(DLC) | 1.01 | 1.04 | 0.98 | 0.06 | 9.0 | 6.5 | 2.5 | 9.0 | 455 | 45 | 3 | 24.0 | Provided | 0 | A | A | 117 | 100 | Example |
| Preparation Example 15 | B3(CLC) | 1.01 | 1.04 | 0.98 | 0.06 | 9.2 | 6.5 | 2.7 | 9.2 | 454 | 46 | 3 | 24.5 | Provided | 20 | A | B | 118 | 100 | Example |
| Preparation Example 16 | A10(DLC) | 1.68 | 1.73 | 1.01 | 0.72 | 9.0 | 6.6 | 2.4 | 9.0 | 750 | 45 | 3 | 24.0 | Not provided | 11 | A | A | 100 | 117 | Example |

The λ/4 film (phase difference layer) of the laminate film exhibits reciprocal dispersibility and Rth(550) is 70 nm.

The angle θ is an angle which is formed between the slow axis of the λ/4 film and the slow axis of the circularly polarized light separating layer (an average value of the maximum and the minimum) and has a positive value clockwise with respect to the slow axis of the λ/4 film.

Further, the total Rth is a total value of values of Rth(550) of members between the polarizer and the organic EL light emitting element.

As shown in the above table, by using the optical laminate film of the present invention in which Re(550) of the circularly polarized light separating layer is in a range of "0.5×ReMax≤Re(550)≤ReMax", in the organic EL display device when turned off, the chromaticity difference can be set within an allowable range in a large area of 55 inches in size. Particularly, since Re(550) of the polarization separating layer satisfies "0.7×ReMax≤Re(550)≤ReMax" (Preparation Examples 7 to 10 and 13 to 15), even in a case where the area is as large as 55 inches, the chromaticity difference can be made less noticeable.

On the other hand, in Comparative Examples (Preparation Examples 2 and 11) in which Re(550) of the circularly polarized light separating layer is out of the range of the present invention, even in a case where a difference in the film thickness of the circularly polarized light separating layer is 0.06 μm, Re(550) significantly varies, and the chromaticity difference is out of the allowable range in the plane of the display device when turned off.

This effect was similarly confirmed for both the rod-like liquid crystal compound (CLC) and the disk-like liquid crystal compound (DLC).

Further, by setting the angle θ formed between the slow axis of the λ/4 film and the slow axis of the circularly polarized light separating layer to −25° to 25°, more suitably, the chromaticity difference can be further suppressed even in a large area of 55 inches.

Further, as shown in Preparation Examples 14 and 15, by adjusting Rth between the polarizer and the organic EL light emitting element by inserting a C-plate, the reflection tint in a case of observation in the oblique direction can be improved.

In addition, as shown in Preparation Example 16, by setting the selective reflection center wavelength of the circularly polarized light separating layer to 700 to 800 nm, the brightness of blue light (around 700 to 800 nm) can be improved while maintaining the reflection tint.

INDUSTRIAL APPLICABILITY

The present invention can be used for various applications as a display device.

EXPLANATION OF REFERENCES

10: organic EL display device
12: polarizer
14: phase difference layer
16: circularly polarized light separating layer
18: organic EL light emitting element
b: blue light
bx: linearly polarized blue light
bL: left circularly polarized blue light
bR: right circularly polarized blue light

What is claimed is:

1. An organic electroluminescent display device comprising:
an optical laminate film comprising, at least:
a polarizer;
a phase difference layer; and
a circularly polarized light separating layer,
wherein the polarizer, the phase difference layer, and the circularly polarized light separating layer are arranged in this order,
an in-plane retardation Re(550) of the phase difference layer is 120 to 160 nm,
the polarizer and the phase difference layer are arranged such that an angle formed between a transmission axis of the polarizer and a slow axis of the phase difference layer is 45°±10°,
the circularly polarized light separating layer is a cholesteric liquid crystal layer formed by fixing a cholesteric liquid crystalline phase and having a liquid crystal compound as a main component,
in a case where an average refractive index of the liquid crystal compound forming the circularly polarized light separating layer is n, a birefringence of the liquid crystal compound forming the circularly polarized light separating layer is Δn, and a selective reflection center wavelength of the circularly polarized light separating layer is λ,
ReMAX [nm]=k×Δn×λ/n (where k=0.213), and
an in-plane retardation Re(550) of the circularly polarized light separating layer satisfies
0.5×ReMax≤Re(550)≤ReMax; and
an organic electroluminescent light emitting element,
wherein the optical laminate film and the organic electroluminescent light emitting element are arranged so as to sandwich the circularly polarized light separating layer between the phase difference layer and the organic electroluminescent light emitting element,
wherein film thickness of the circularly polarized light separating layer is 0.8 to 1.3 μm.

2. The organic electroluminescent display device according to claim 1,
wherein a total of retardations Rth(550) in a thickness direction of members arranged between the polarizer and the organic electroluminescent light emitting element is −50 to 50 nm.

3. The organic electroluminescent display device according to claim 1, further comprising:
a C-plate between the polarizer and the organic electroluminescent light emitting element.

* * * * *